(12) United States Patent
Wang et al.

(10) Patent No.: US 11,257,911 B2
(45) Date of Patent: Feb. 22, 2022

(54) SACRIFICIAL LAYER FOR SEMICONDUCTOR PROCESS

(71) Applicant: Taiwan Semiconductor Manufacturing Company, Ltd., Hsinchu (TW)

(72) Inventors: Tsan-Chun Wang, Hsinchu (TW); Su-Hao Liu, Jhongpu Township (TW); Liang-Yin Chen, Hsinchu (TW); Huicheng Chang, Tainan (TW); Yee-Chia Yeo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 101 days.

(21) Appl. No.: 16/837,214

(22) Filed: Apr. 1, 2020

(65) Prior Publication Data

US 2021/0313435 A1 Oct. 7, 2021

(51) Int. Cl.
*H01L 29/40* (2006.01)
*H01L 21/311* (2006.01)
*H01L 21/033* (2006.01)
*H01L 21/285* (2006.01)
*H01L 29/45* (2006.01)
*H01L 21/3115* (2006.01)

(52) U.S. Cl.
CPC ........ *H01L 29/401* (2013.01); *H01L 21/0337* (2013.01); *H01L 21/28518* (2013.01); *H01L 21/31155* (2013.01); *H01L 29/456* (2013.01)

(58) Field of Classification Search
CPC .............. H01L 29/401; H01L 29/456; H01L 21/28518; H01L 21/31155; H01L 21/0337
USPC ....................................................... 257/288
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2013/0062669 A1* | 3/2013 | Chen ................ H01L 29/66545 257/288 |
| 2014/0282326 A1 | 9/2014 | Chen et al. |

(Continued)

*Primary Examiner* — Caleen O Sullivan
(74) *Attorney, Agent, or Firm* — Slater Matsil, LLP

(57) ABSTRACT

A method of forming a semiconductor device includes forming a source/drain region and a gate electrode adjacent the source/drain region, forming a hard mask over the gate electrode, forming a bottom mask over the source/drain region, wherein the gate electrode is exposed, and performing a nitridation process on the hard mask over the gate electrode. The bottom mask remains over the source/drain region during the nitridation process and is removed after the nitridation. The method further includes forming a silicide over the source/drain region after removing the bottom mask.

20 Claims, 24 Drawing Sheets

(56) References Cited

U.S. PATENT DOCUMENTS

2016/0126102 A1* 5/2016 Chang .................. H01L 29/665
    438/308
2020/0091011 A1* 3/2020 Khaderbad ......... H01L 27/0924

* cited by examiner

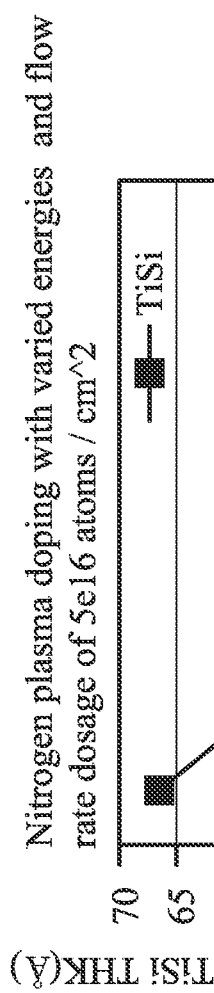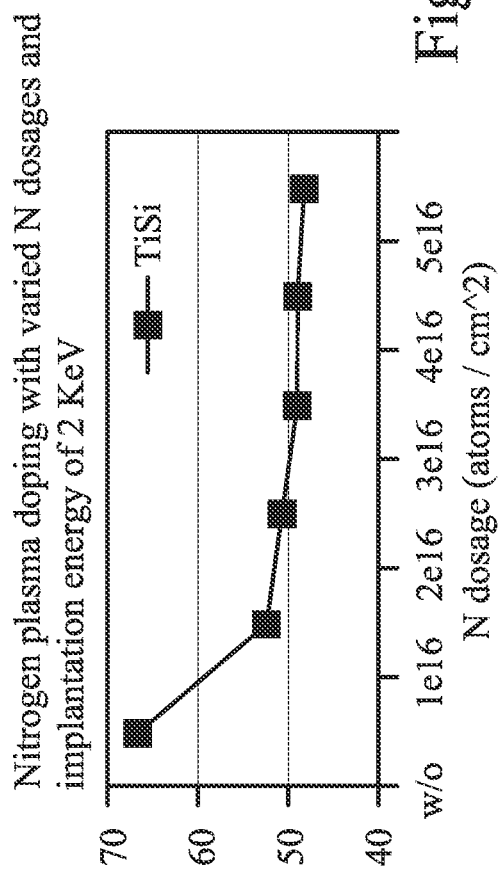
Figure 13B
Figure 13C

SACRIFICIAL LAYER FOR SEMICONDUCTOR PROCESS

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13B illustrates effects of varying the implantation energy for a nitrogen plasma doping process, in accordance with some embodiments.

FIG. 13C illustrates effects of varying the dosage for a nitrogen plasma doping process, in accordance with some embodiments.

DETAILED DESCRIPTION

Figure 1:
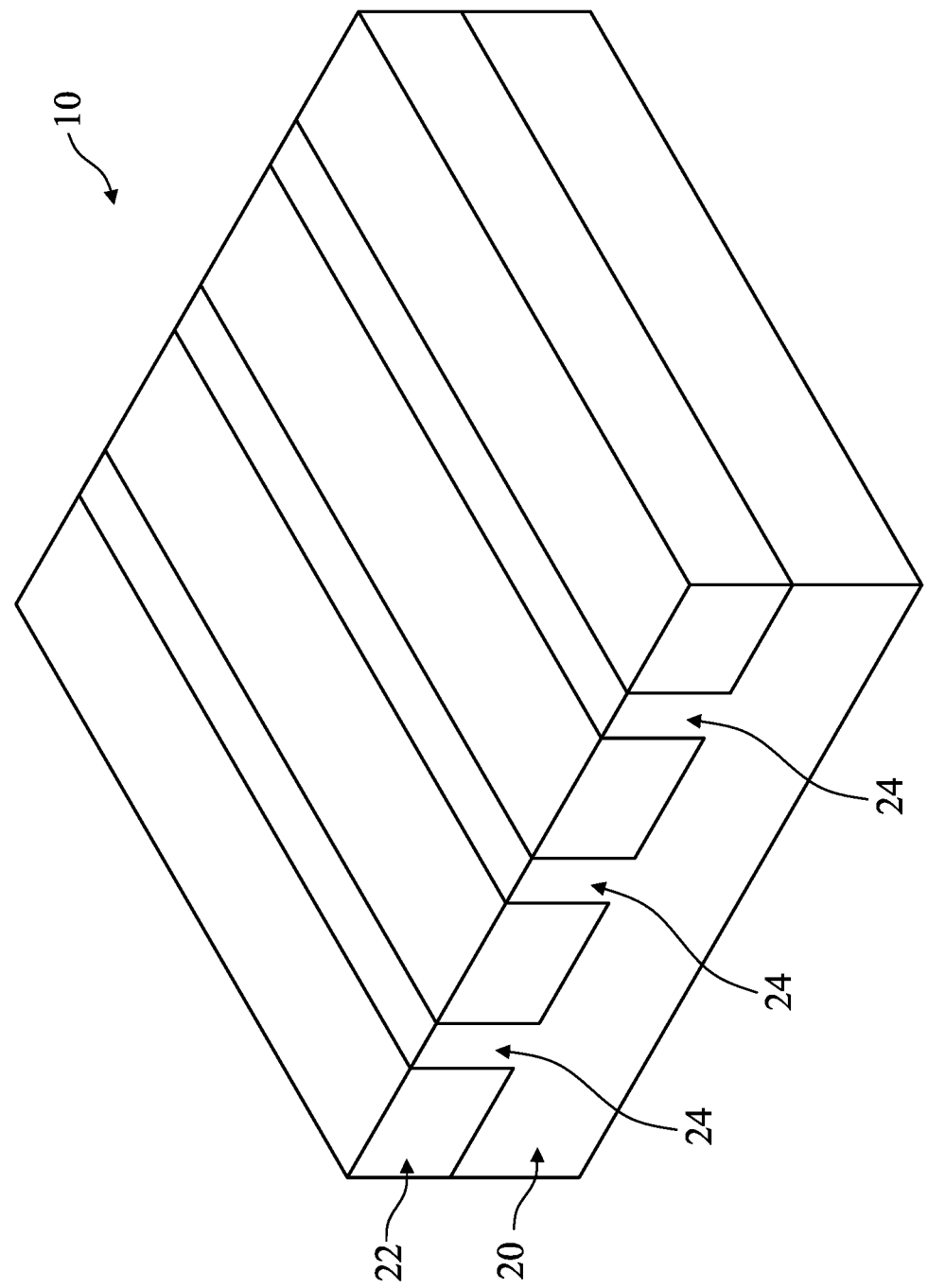
FIGS. 1-7, 8A, 8B, 9A, 9B, 10, 11, 12A, 13A, 14, 15, 16, 17, 18, and 19 are perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and the methods of forming the same are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs), including both p-FETs and n-FETs, is used as an example to explain the concept of the present disclosure. Other types of transistors such as planar transistors may also adopt the concept of the present disclosure. In accordance with some embodiments of the present disclosure, a nitridation, such as a nitrogen plasma doping process, is applied to a hard mask, such as an amorphous silicon (a-Si) sacrificial layer. The a-Si sacrificial layer may be used in place of, for example, a silicon nitride (SiN) sacrificial layer as a hard mask over a gate electrode. The a-Si sacrificial layer is less susceptible to the etching used to form an opening to expose source/drain regions in preparation of forming metal contacts to the source/drain regions. As such, the gate electrode may have a greater height.

While the a-Si sacrificial layer is less susceptible than a SiN sacrificial layer to the etching for the source/drain contacts, the a-Si sacrificial layer may be more susceptible to silicidation. Generally, the exposed sections of the source/drain regions are silicided to reduce contact resistance. The silicidation process may involve deposition of a metal layer, such as titanium, and annealing to form a silicide, e.g., TiSi in this example. The silicide may also be formed on the a-Si hard mask, which may lead to a subsequent planarization removing more of the a-Si material and thereby reducing the height of the metal gate. Reduction of the metal gate height may be disadvantageous because it may lead to higher gate resistance. In order to reduce the thickness of silicide formed over the a-Si sacrificial layer, a nitridation by a process such as nitrogen plasma doping is performed on the a-Si sacrificial layer. The nitridated a-Si sacrificial layer results in a smaller thickness of silicide being formed on it, while maintaining the benefit of using a-Si to reduce the loss of metal gate height during a subsequent planarization, such as a chemical mechanical polish (CMP). The reduced thickness of silicide formed over the a-Si sacrificial layer may reduce the amount of material removed by the following planarization and avoid loss of metal gate height, improving device functioning.

FIGS. 1-7, 8A, 8B, 9A, 9B, 10, 11, 12A, 13A, 14, 15, 16, 17, 18, and 19 illustrate the cross-sectional views and perspective views of intermediate stages in the formation of a FinFET in accordance with some embodiments of the present disclosure.

Referring first to FIG. 1, there is shown a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as fins or fins 24. It should be understood that two fins 24 are shown in FIG. 1 for illustrative purposes only that more or fewer fins 24 may be used. The top surfaces of fins 24 and the top surfaces of STI regions 22 may be substantially level with each other in accordance with some embodiments. In accordance with some embodiments, fins 24 are parts of the original substrate 20, and hence the material of fins 24 is the same as that of substrate 20. In accordance with alternative embodiments, fins 24 are replacement strips formed by etching the portions of substrate 20 between STI regions 22 to form recesses, and performing an epitaxy to regrow another semiconductor material in the recesses. Accordingly, fins 24 may be formed of a semiconductor material different from that of substrate 20. In accordance with some embodiments, fins 24 are formed of silicon germanium, silicon carbon, or an III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
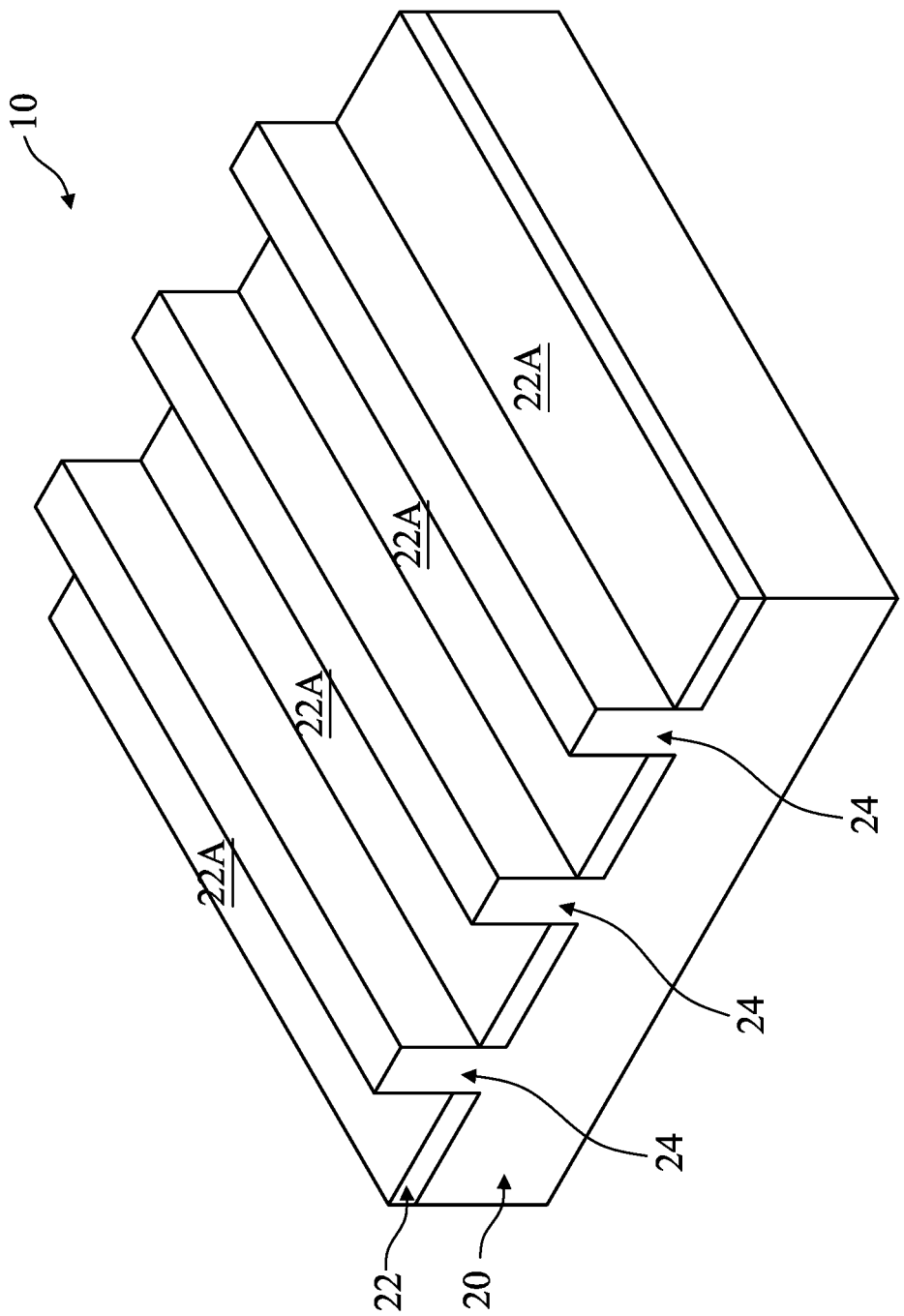

Referring to FIG. 2, STI regions 22 are recessed, so that the top portions of fins 24 protrude higher than the top surfaces 22A of the remaining portions of STI regions 22. The etching may be performed using a dry etching process, wherein $HF_3$ and $NH_3$ are used as the etching gases. During the etching process, plasma may be generated. Argon may also be included. In accordance with alternative embodiments, the recessing of STI regions 22 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
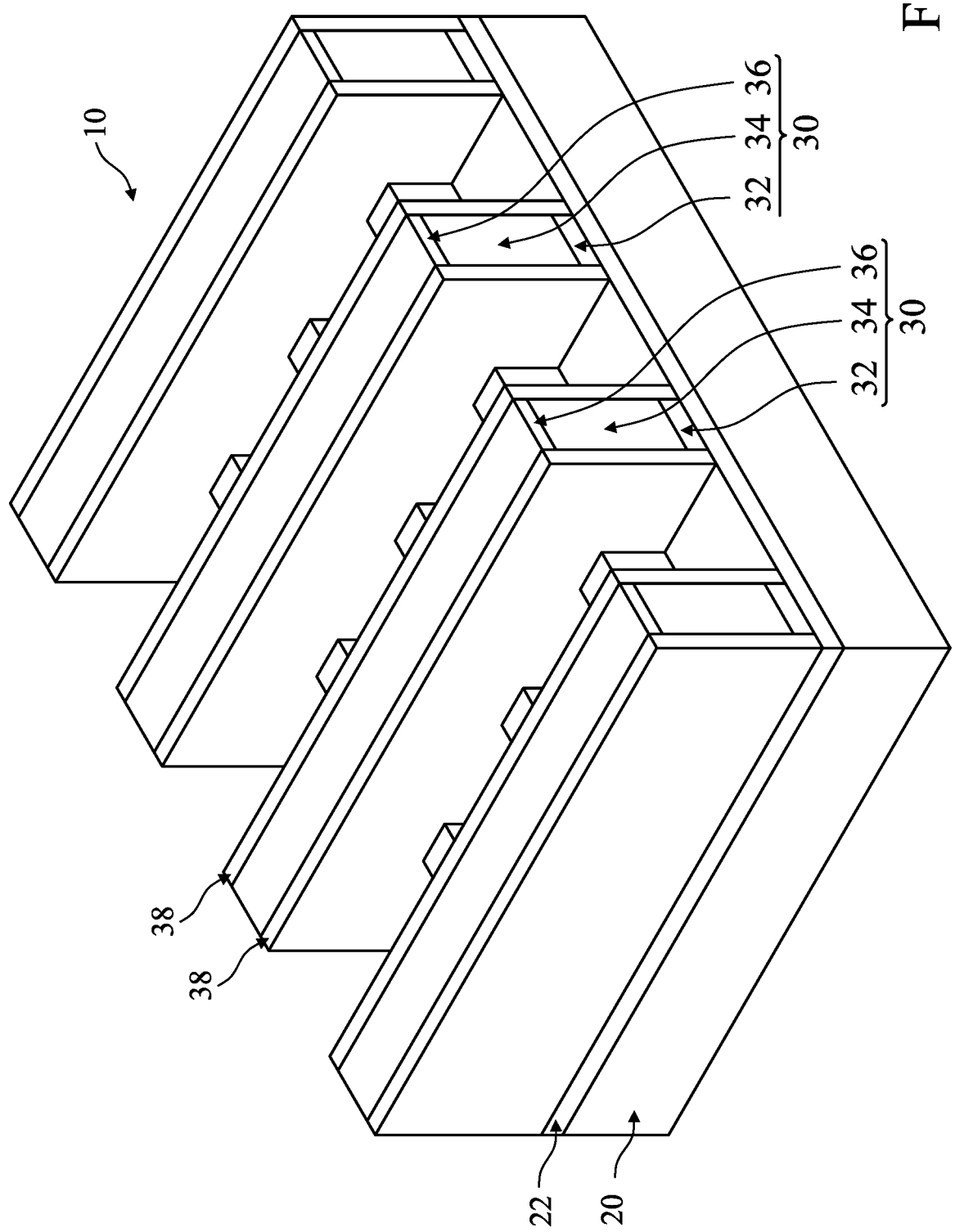

Referring to FIG. 3, dummy gate stacks 30 is formed to extend on the top surfaces and the sidewalls of the fins 24. Dummy gate stacks 30 may include dummy gate dielectrics 32 and dummy gate electrodes 34 over dummy gate dielectrics 32. It should be understood that four dummy gate stacks 30 are shown for illustrative purposes only that and that more or fewer dummy gate stacks 30 may be used. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbo-nitride, or multi-layers thereof. Dummy gate stacks 30 may cross over a single one or a plurality of fins 24 and/or STI regions 22. Dummy gate stacks 30 also have lengthwise directions perpendicular to the lengthwise directions of fins 24.

Next, gate spacers 38 are formed on the sidewalls of dummy gate stacks 30. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
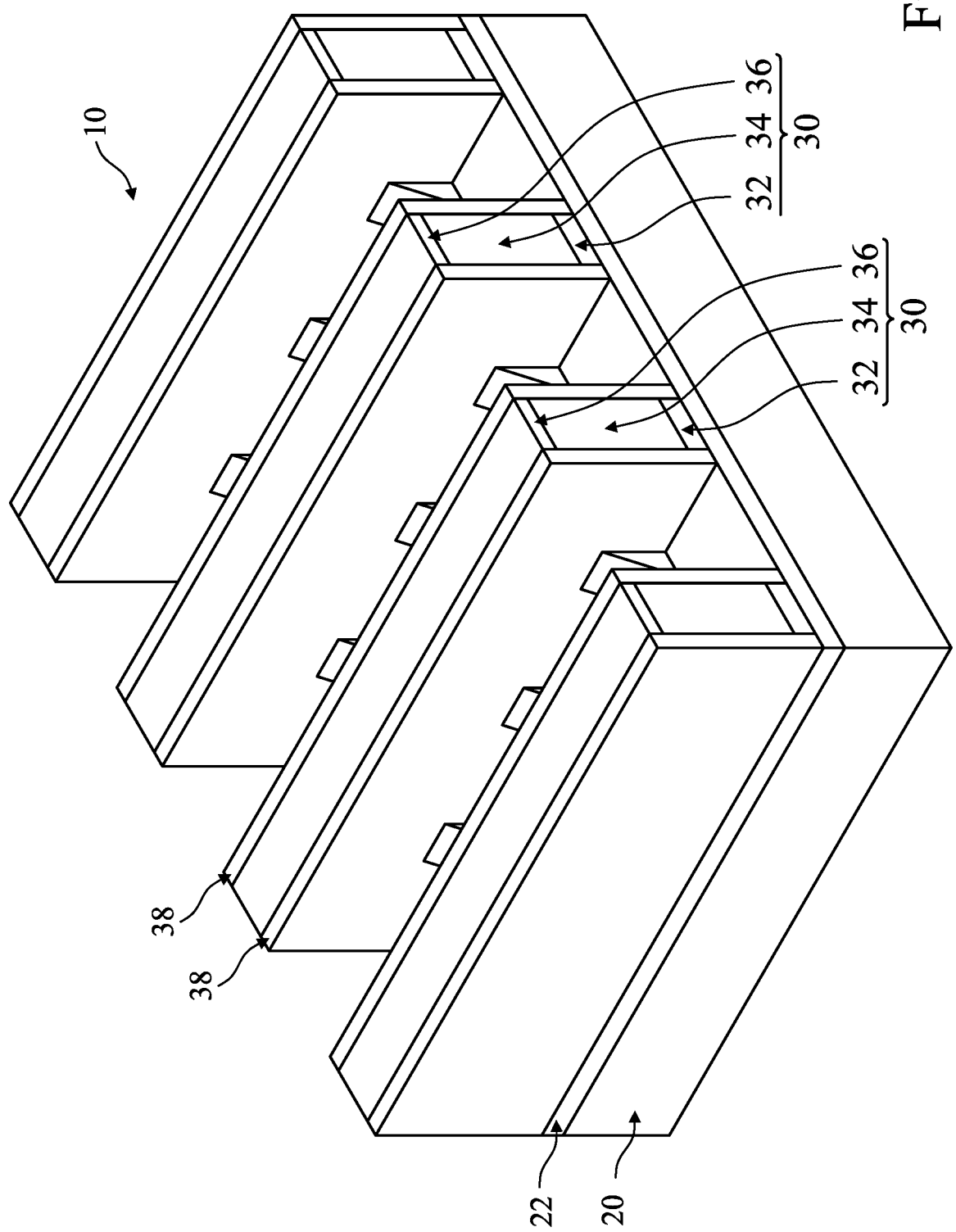

An etching step is then performed to etch the portions of fins 24 that are not covered by dummy gate stack 30 and gate spacers 38, resulting in the structure similar to that shown in FIG. 4. In some embodiments, the recessing is isotropic, and hence the portions of fins 24 adjacent to the dummy gate stacks 30 and gate spacers 38 are not etched. In other embodiments, the recessing is anisotropic, and hence the portions of fins 24 directly underlying dummy gate stacks 30 and gate spacers 38 are protected, and are not etched. The top surfaces of the recessed fins 24 may be lower than the top surfaces 22A of STI regions 22 in accordance with some embodiments. Recesses 40 are accordingly formed between STI regions 22. Recesses 40 are located on the opposite sides of dummy gate stacks 30, and include some portions lower than the top surfaces of STI regions 22, and some portions higher than the top surfaces of STI regions 22 and between neighboring gate stacks 30.

Figure 5:
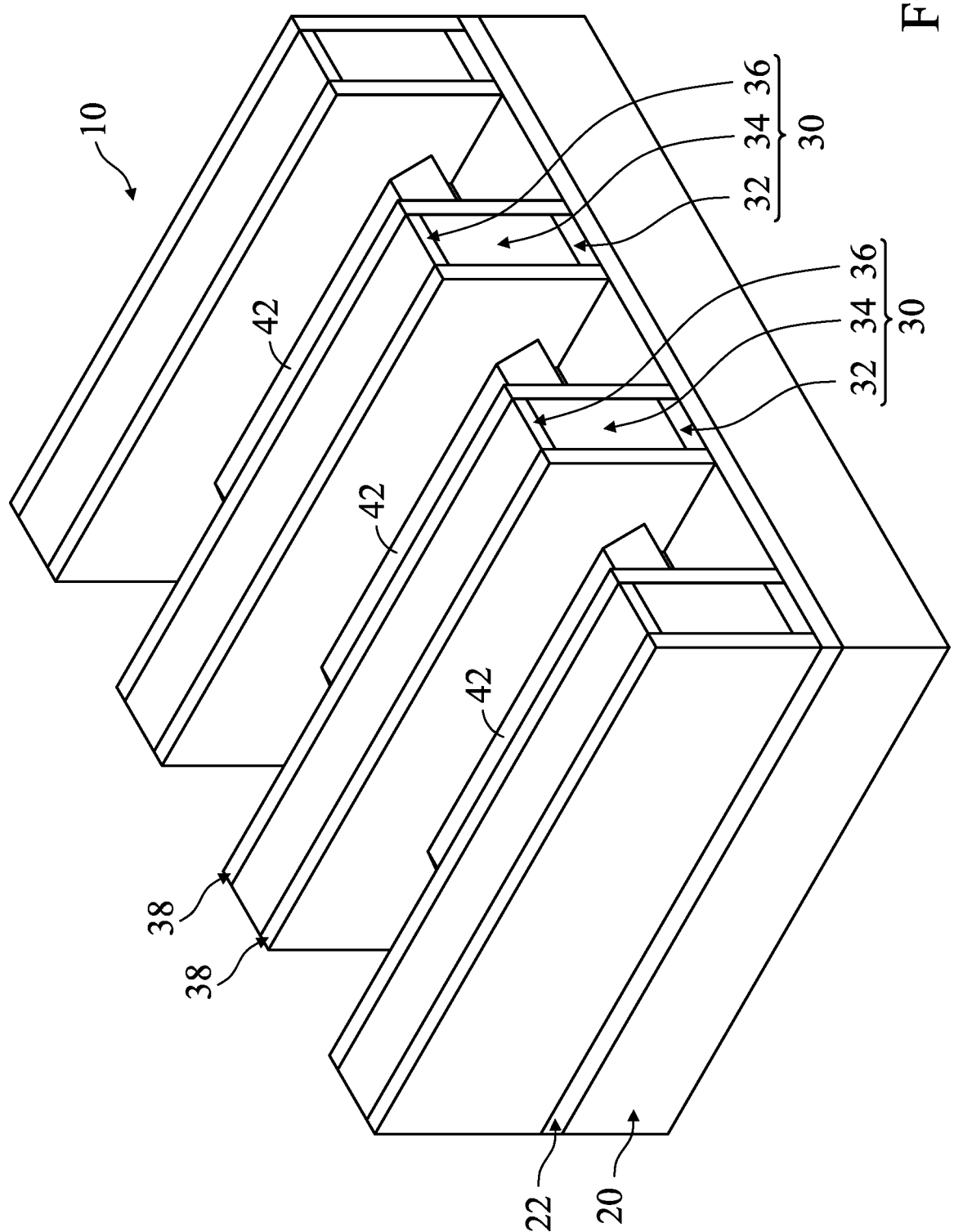

Next, an epitaxy process is performed to form epitaxy regions 42, which are selectively grown from remaining portions of the fins 24 in the recesses 40, resulting in the structure in FIG. 5. In accordance with some embodiments, epitaxy regions 42 include silicon germanium or silicon. In accordance with some embodiments of the present disclosure, a p-type dopant such as boron or indium or gallium is in-situ doped into epitaxy portions 42 with the proceeding of the epitaxy. After epitaxy regions 42 fully fill recesses 40, epitaxy regions 42 start expanding horizontally, and facets may be formed. With the proceeding of the epitaxy, the epitaxy regions 42 grown from neighboring recesses merge with each other to form an integrated epitaxy region 42. In accordance with some embodiments, the formation of epitaxy region 42 is finished when the top surface of epitaxy regions 42 has become planar. In accordance with other embodiments of the present disclosure, the formation of epitaxy region 42 is finished when the top surface of epitaxy regions 42 is still wavy. In some embodiments, air gaps 43 are located under the merged facets of epitaxy regions 42. In other embodiments, epitaxy regions 42 fill the space above the top surfaces 22A of the STI regions 22. Throughout the description, epitaxy regions 42 are alternatively referred to as source/drain regions 42.

Figure 6:
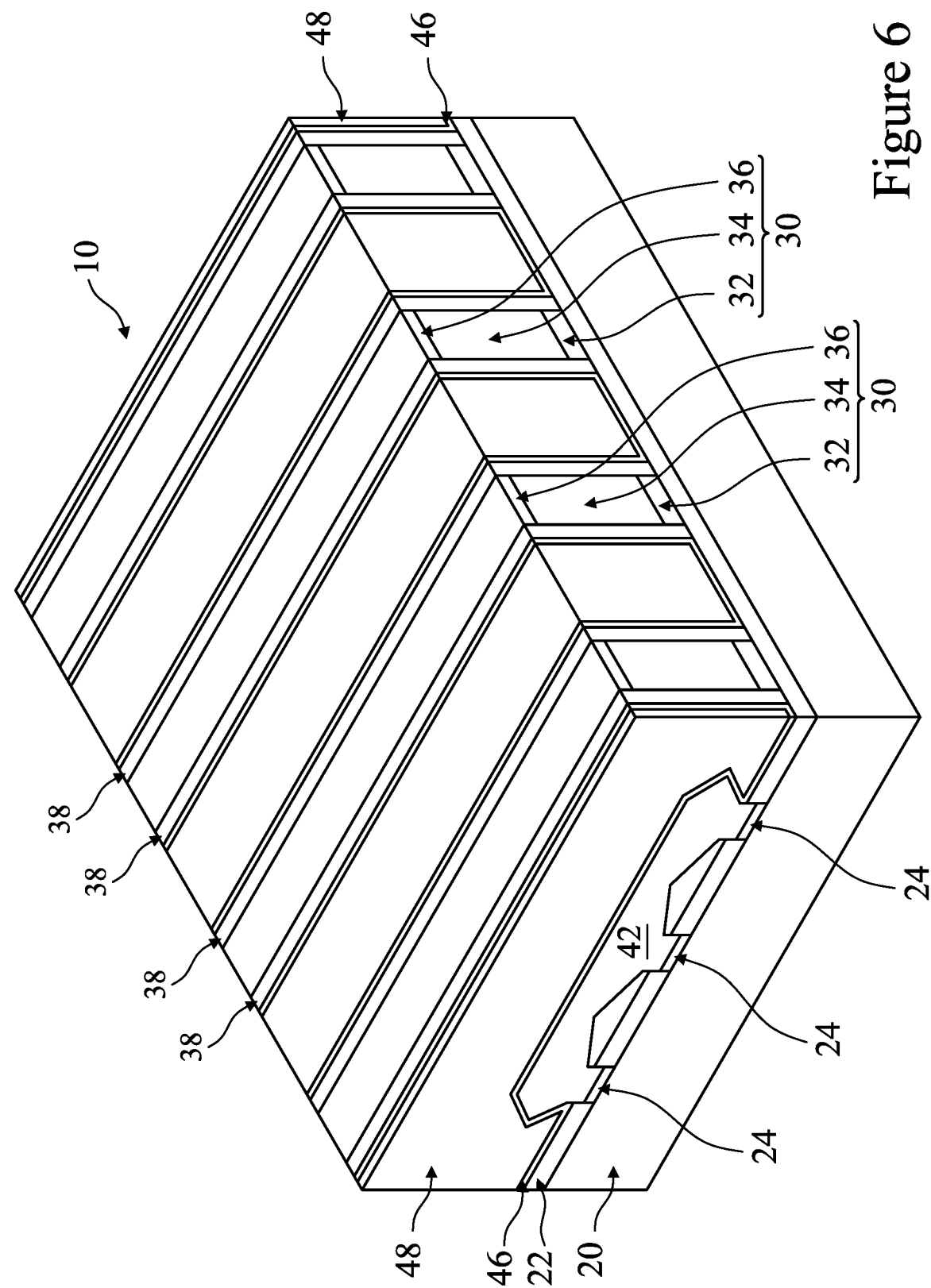

FIG. 6 illustrates a perspective view of the structure after the formation of a first Contact Etch Stop Layer (CESL) 46 and a first Inter-Layer Dielectric (ILD) 48. First CESL 46 may be formed of silicon oxide, silicon nitride, silicon carbo-nitride, or the like, and may be formed using CVD, ALD, or the like. First ILD 48 may include a dielectric material formed using, for example, FCVD, spin-on coating, CVD, or another deposition method. First ILD 48 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. A planarization process such as a Chemical Mechanical Polish (CMP) process or a mechanical grinding process may be performed to level the top surfaces of first ILD 48, dummy gate stacks 30, and gate spacers 38 with each other.

Figure 7:
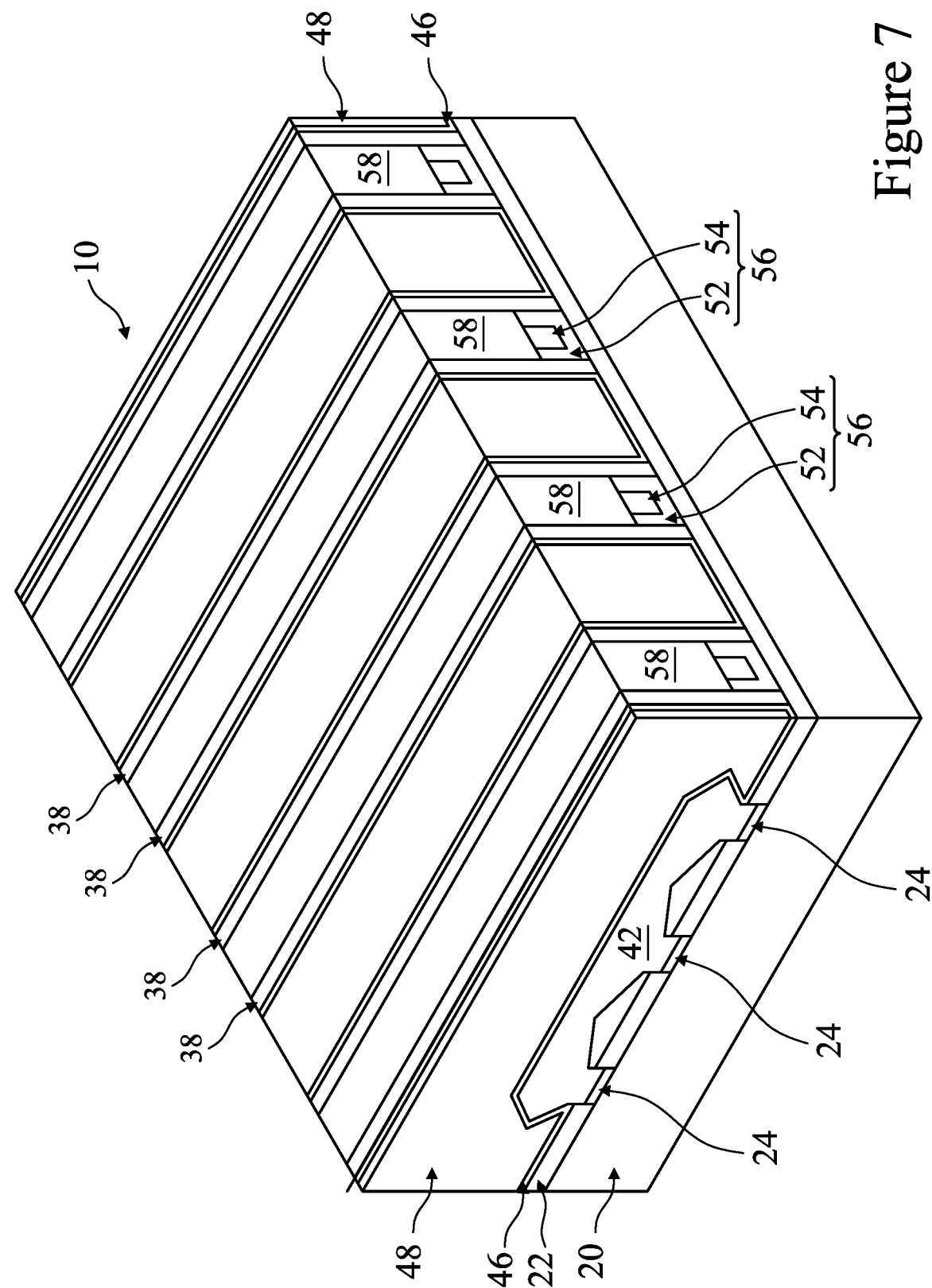

Next, as illustrated in FIG. 7, dummy gate stacks 30, which include hard mask layers 36, dummy gate electrodes 34, and dummy gate dielectrics 32, are replaced with replacement gate stacks 56, which include metal gates 54 and gate dielectrics 52. When forming replacement gate stacks 56, hard mask layers 36, dummy gate electrodes 34, and dummy gate dielectrics 32 as shown in FIG. 6 are first removed in one or a plurality of etching steps, resulting in trenches/openings to be formed between gate spacers 38. The top surfaces and the sidewalls of fins 24 are exposed to the resulting trenches.

Next, (replacement) gate dielectric layers 52 are formed, which extend into the trenches between gate spacers 38. In accordance with some embodiments of the present disclosure, each of gate dielectric layers 52 may include an Interfacial Layer (IL) (not individually shown) as its lower part, which contacts the exposed surfaces of the corresponding fins 24. The IL may include an oxide layer such as a silicon oxide layer, which is formed through the thermal oxidation of fins 24, a chemical oxidation process, or a deposition process. Gate dielectric layer 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of fins 24 and the sidewalls of gate spacers 38. In accordance with some embodiments of the present disclosure, the high-k dielectric layer is formed using ALD or CVD.

Referring further to FIG. 7, gate electrodes 54 are formed over gate dielectrics 52. Gate electrodes 54 may include conductive sub-layers, such as diffusion barrier layers, work-function layers, conductive fill material, etc. The sub-layers are not shown separately, while the sub-layers are distinguishable from each other. The deposition of the sub-layers may be performed using a conformal deposition method(s) such as ALD or CVD. For example, the conductive sub-layers may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to the requirement of the respective FinFET (such as p-type FinFET). For example, when the FinFET is a p-type FinFET, the work-function layer may include a TaN layer, a TiN layer over the TaN layer, and a TiAl layer over the TiN layer. In another example, when the FinFET is an n-type FinFET, the work-function layer may comprise Ta, Al, C, O, and/or a combination of these. After the deposition of the work-function layer(s), a barrier layer, which may be another TiN layer, is formed.

Next, a metallic material is deposited to fill the remaining trenches between gate spacers 38. The metallic material may be formed of tungsten or cobalt, for example. In a subsequent step, a planarization step such as a CMP process or a mechanical grinding process is performed, so that the portions of the gate dielectric layers, conductive sub-layers, and the metallic material over first ILD 48 are removed. As a result, metal gate electrodes 54 and gate dielectrics 52 are formed. Gate electrodes 54 and gate dielectrics 52 are in combination referred to as replacement gate stacks 56. The top surfaces of replacement gate stacks 56, gate spacers 38, first CESL 46, and first ILD 48 may be substantially coplanar at this time.

FIG. 7 also illustrates the formation of hard masks 58 in accordance with some embodiments. The formation of hard masks 58 may include performing an etching step to recess gate stacks 56, so that recesses are formed between gate spacers 38, filling the recesses with a dielectric material comprising amorphous silicon, and then performing a planarization process such as a CMP process or a mechanical grinding process to remove excess portions of the dielectric material. Hard masks 58 are formed to comprise amorphous silicon (a-Si). The a-Si hard masks 58 may be formed by a process such as PECVD using $SiH_4$ as a source of Si at flow rate of 1-100 sccm for a time interval in a range of about 20 seconds to about 100 seconds. As discussed in greater detail below, the use of a-Si as a hard mask or sacrificial layer in place of a silicon nitride (SiN) sacrificial layer may reduce the gate height lost during a subsequent etching of an opening to expose source/drain regions in preparation of forming metal contacts to the source/drain regions. For example, a-Si has a higher etch selectivity over SiN during a subsequent etch process to form contact openings to the source/drain regions. The higher etch selectivity allows for a thinner hard mask layer to be used to protect the gate stacks 56 during subsequent processing, and hence, allows for a greater gate height. As discussed in greater detail below, a nitridation process is performed on the a-Si to reduce the amount of silicidation during the contact formation.

Figure 8A:
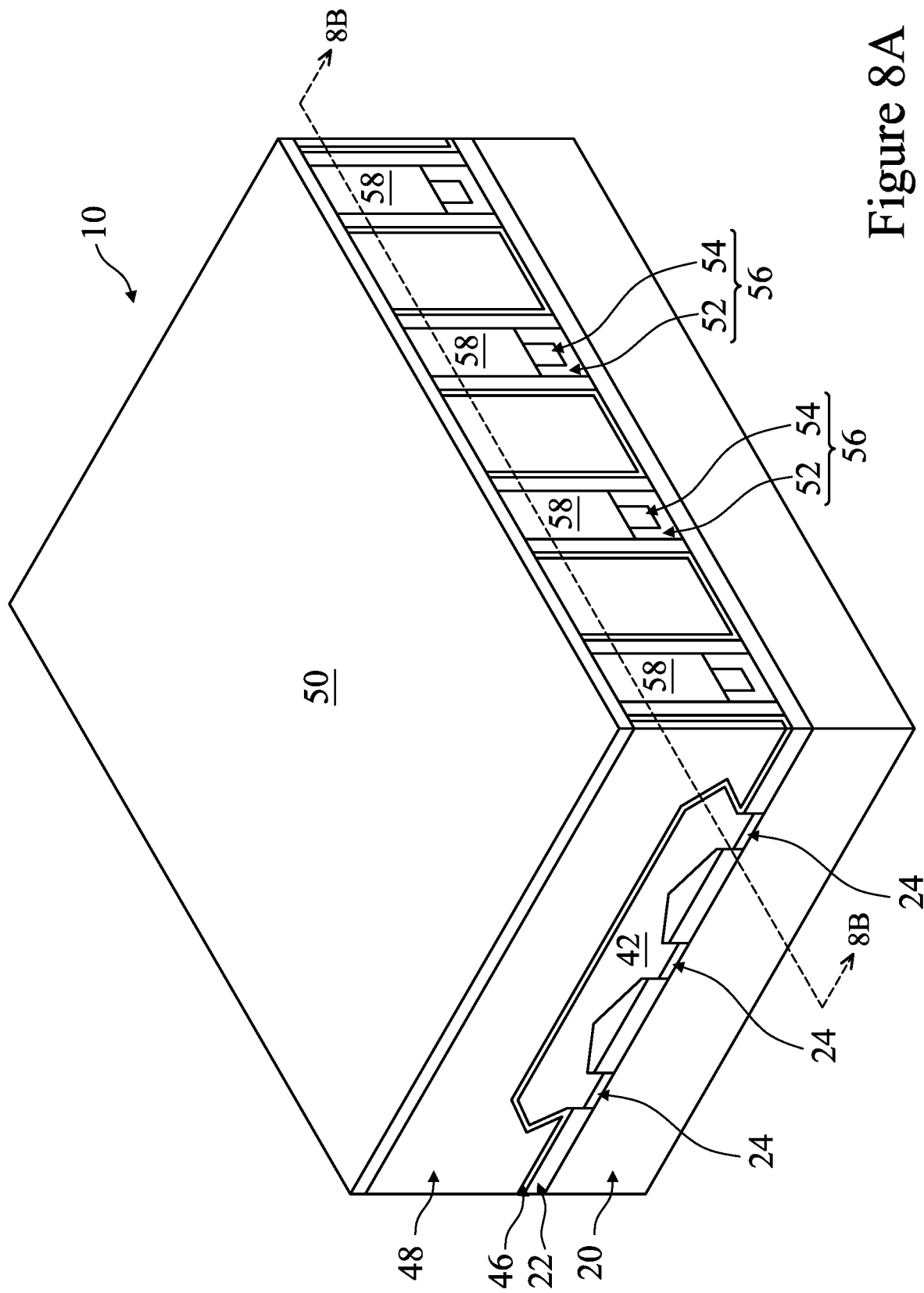
Figure 8B:
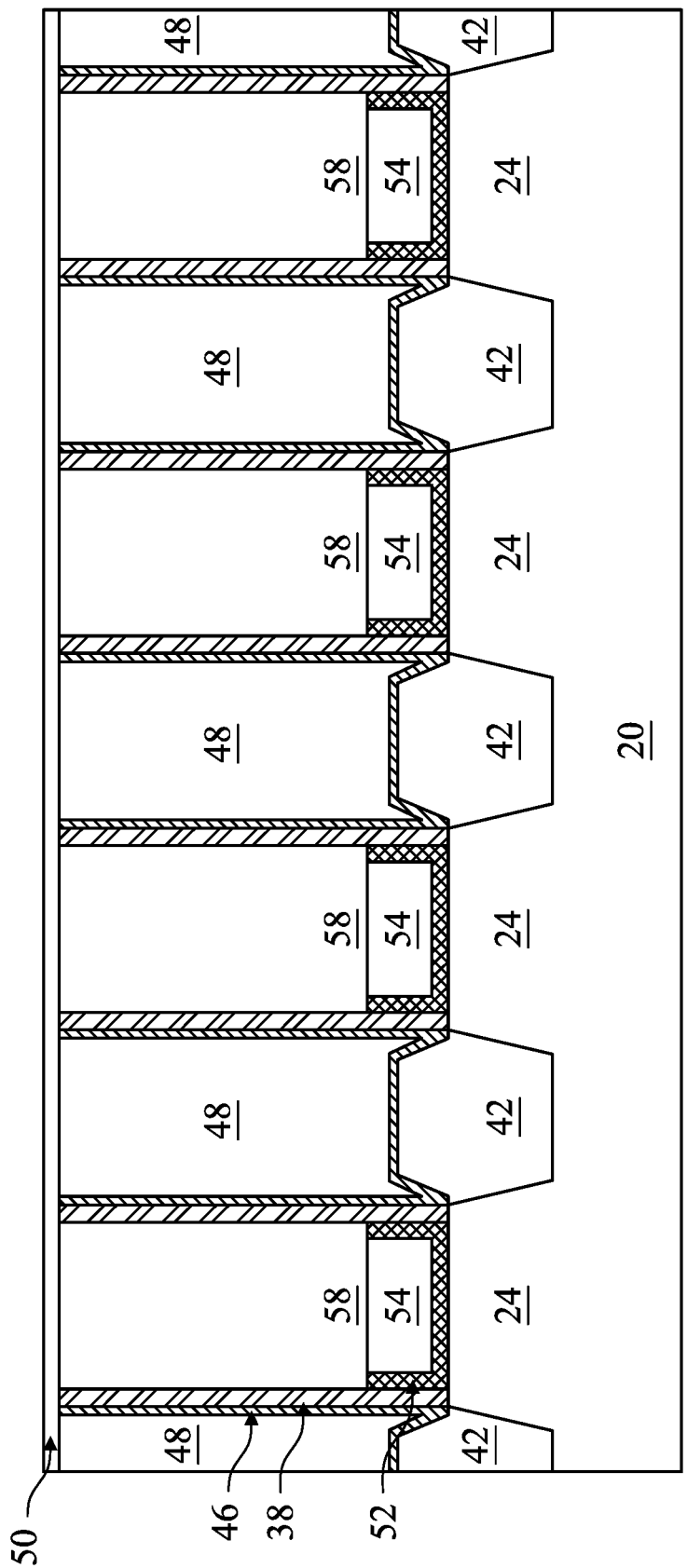

FIGS. 8A and 8B illustrate the formation of a photoresist 50 over the hard masks 58, gate spacers 38, first CESL 46, and first ILD 48. FIG. 8B illustrates a cross-sectional view of the structure shown in FIG. 8A, wherein the cross-sectional view is obtained from the vertical plane containing line 8B-8B in FIG. 8A. The photoresist 50 is used to pattern the first ILD 48 and first CESL 46 to form contact openings to the epitaxial regions 42, as described below with respect to FIG. 9.

FIG. 8B illustrates an embodiment in which the epitaxy regions 42 are raised above the upper surface of the fins 24. In other embodiments, the epitaxy regions 42 may be level with or recessed from the upper surface of the fins 24. Additionally, in some embodiments, one or more additional mask layers (not shown) may be utilized. For example, in some embodiments additional masking layers and/or anti-reflective coatings may be utilized to enhance patterning and to provide additional protection during subsequent etch processes.

Figure 9A:
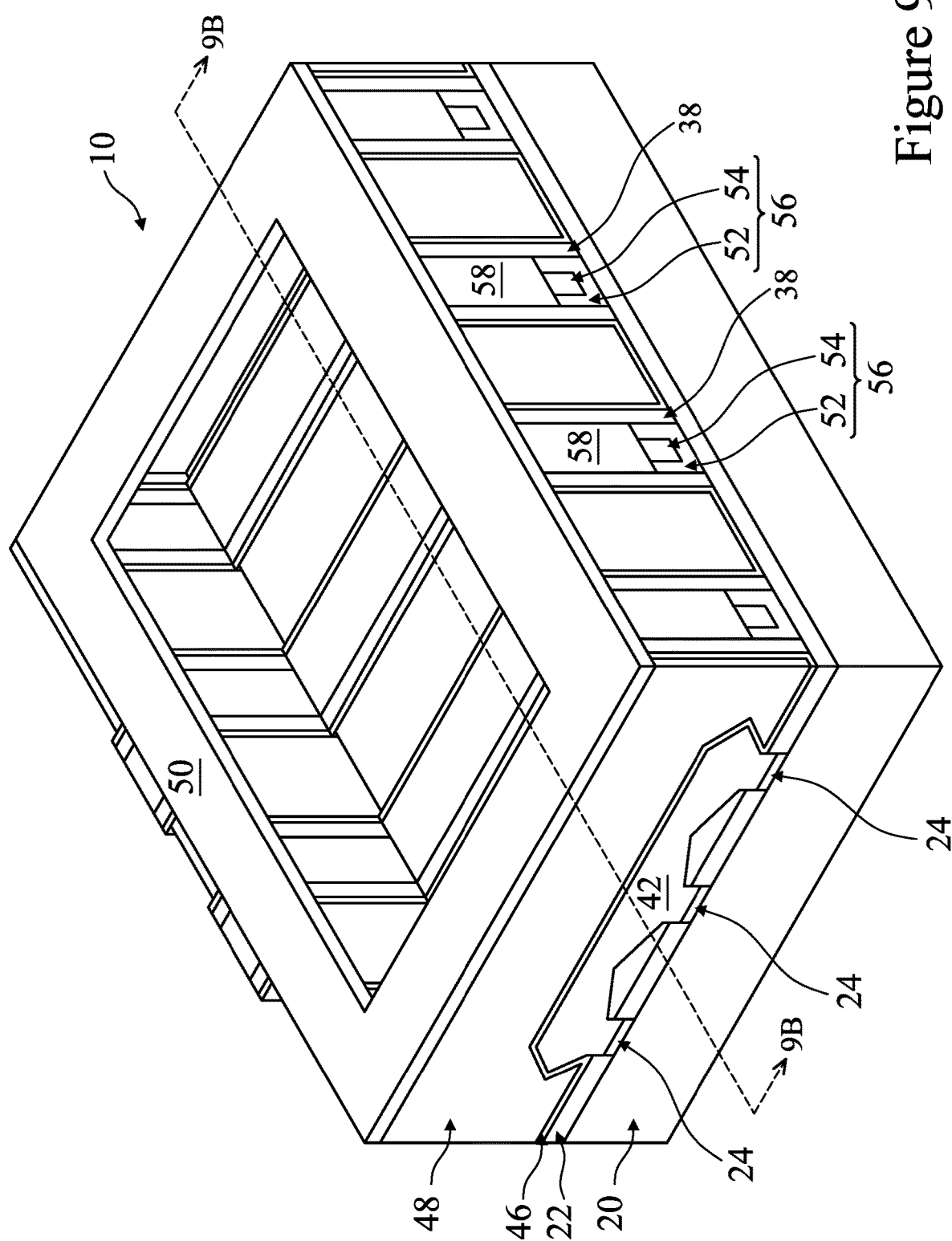
Figure 9B:
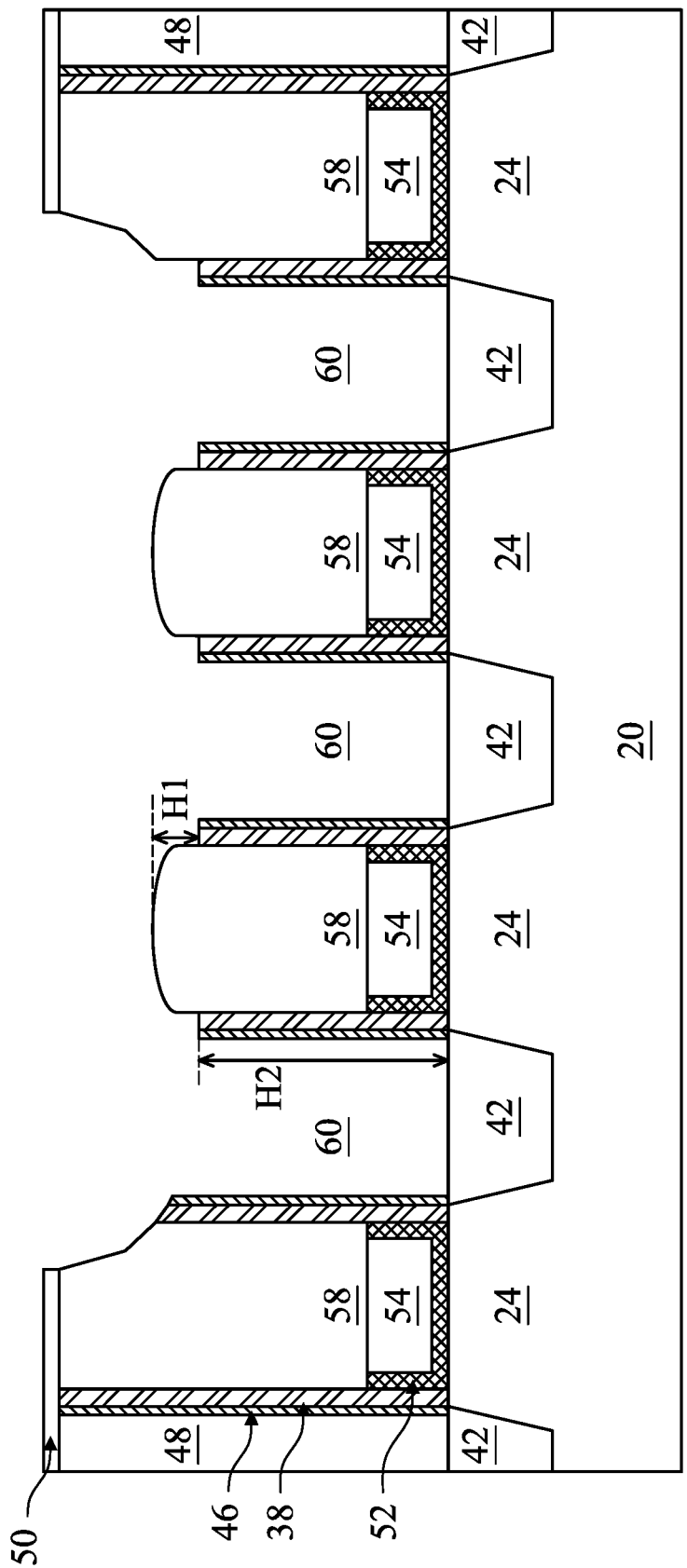

FIGS. 9A and 9B illustrate the formation of contact openings 60. The formation of contact openings 60 include etching first ILD 48 to expose the underlying portions of first CESL 46, and then etching the exposed portions of first CESL 46 to reveal epitaxy regions 42. The first ILD 48 and first CESL 46 may be patterned using photolithography techniques. Generally, photolithography techniques utilize a photoresist material, such as the photoresist 50, that is deposited, irradiated (exposed), and developed to remove a portion of the photoresist material. In this embodiment, the photoresist 50 is patterned to exposed portions of the first ILD 48 that is to be removed to form the contact openings in subsequent steps.

Portions of the photoresist 50 may be consumed during the etch process. For example, as shown in FIG. 9B, the photoresist is removed and a portion of the hard mask 58 over the middle two illustrated metal gates 54 has been etched, resulting in the hard mask 58 having a rounded profile. A rounded top portion of the hard mask 58 may have a height H1 measured between a top surface of the hard mask 58 and a surface level with a top surface of the etched gate spacers 38 in a range of about 3 nm to about 7 nm. Heights H1 in this range provide a sufficient region to accept the nitrogen dopant. Embodiments having a height less than about 3 nm may not have a sufficient height to accept the nitrogen dopant. Embodiments having a height greater than about 7 nm may have too much a-Si thickness which needs to be removed later.

FIG. 9B further illustrates that only a portion of the hard mask 58 over the metal gates 54 on the left and right side has been removed. This may be caused by only one side of the photoresist 50 being exposed during the etch process. As illustrated in FIG. 9B, this effect may cause an upper portion of the sidewall of the hard mask 58 to be concave. The top surfaces of the epitaxy regions 42 may be etched during the formation of the contact openings 60. In some embodiments in accordance with FIG. 9B, top surfaces of the epitaxy regions 42 are level with top surfaces of fins 24. In other embodiments, portions of the epitaxy regions 42 remain above a surface level with the top surfaces of fins 24. In still other embodiments, the epitaxy regions 42 are recessed below the top surfaces of fins 24.

In this example, the contact openings 60 may have depths H2 as measured from upper surfaces of the first CESL 46 and the gate spacers in a range of about 29 nm to about 35 nm. Using a-Si for the hard masks 58 in place of, for example, SiN may reduce the thickness of the hard masks 58 etched away in this etch process, which may be beneficial for protecting the underlying replacement gate stacks 56 in a subsequent planarization process. In accordance with some embodiments of the present disclosure, as illustrated above in FIG. 8A, gate spacers 38 are spaced apart from nearest contact openings 60 by some remaining portions of the first CESL 46. In accordance with other embodiments, the sidewalls of gate spacers 38 are exposed to contact openings 60.

Figure 10:
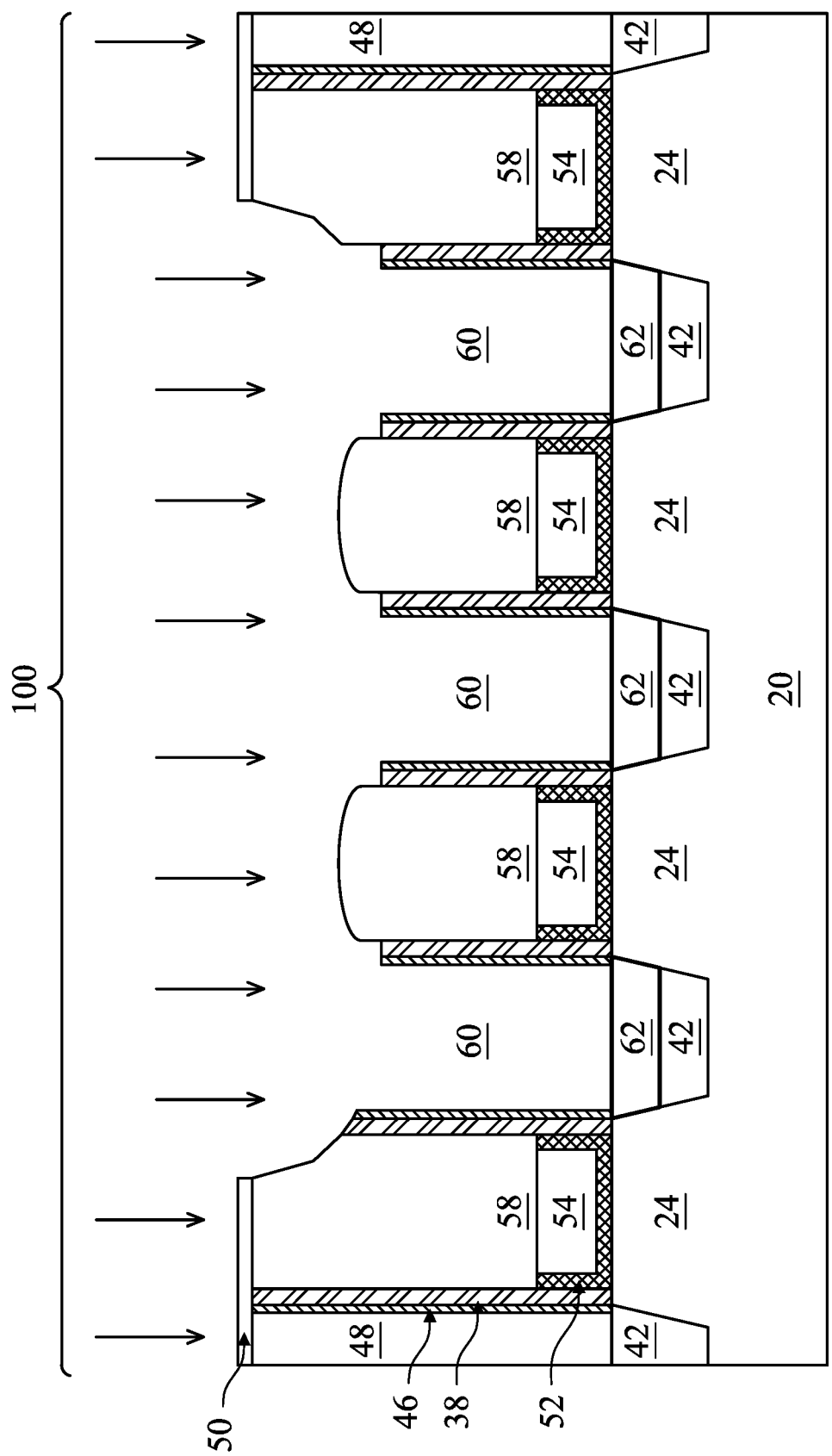

Referring to FIG. 10, a patterned mask (not shown) may be formed, which may be used to cover some device regions such as n-type FinFET regions, while leaving some other portions such as the p-type FinFET regions exposed for further processing, such as the processing discussed below, or vice versa. A pre-amorphization implantation (PAI, also sometimes referred to as pre-amorphous implantation) process 100 is performed for forming PAI regions 62 in epitaxy regions 42. In accordance with some embodiments, silicon or germanium is implanted. In accordance with some embodiments, an inert species such as neon, argon, xenon, and radon is implanted. The lattice structure of the implanted regions is destructed by the PAI 100, and PAI regions 62 are converted into amorphous regions. PAI regions 62 are not shown in subsequent figures for simplicity. The PAI may increase activation of a subsequently implanted dopant, such as e.g. boron, and prevent or reduce channeling of the dopant by the lattice structure during the implantation.

Next, an impurity (dopant) implantation may be performed. For example, in accordance with some embodiments related to the formation of p-type FinFETs, a p-type impurity such as boron, gallium, and/or indium may be implanted. In accordance with other embodiments related to the formation of n-type FinFETs, an n-type impurity (dopant) implantation may be performed. For example, phosphorus, arsenic, and/or antimony may be implanted. In accordance with other embodiments, the epitaxy regions 42 are doped with impurities in situ with their formation and the processes of forming the patterned mask, the PAI 100, and the p-type or n-type impurity (dopant) implantation are skipped.

Figure 11:
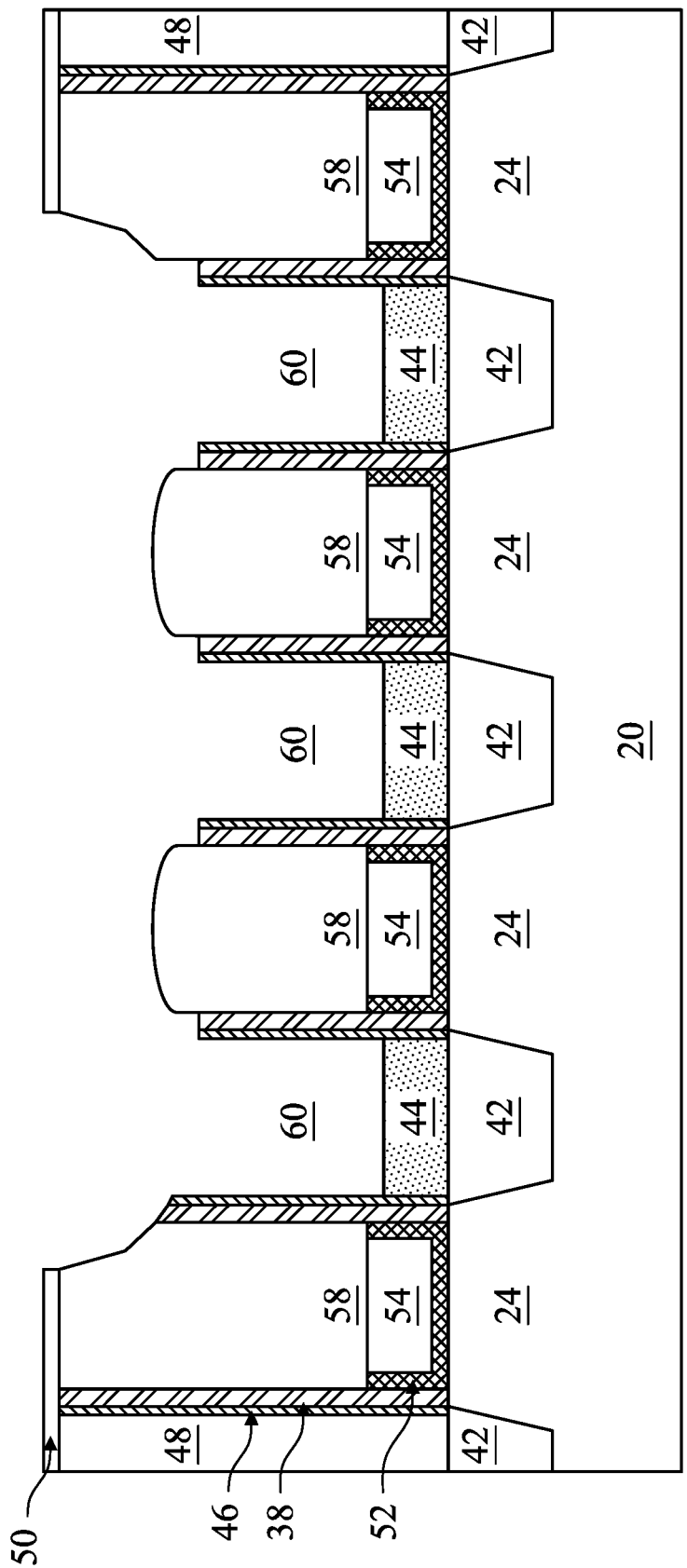

Referring to FIG. 11, bottom masks 44 are formed on bottom surfaces of the openings 60, covering the source/drain regions 42 during subsequent processing. In some embodiments, the bottom masks 44 may comprise one or more layers of bottom anti-reflective coatings (BARCs), such as amorphous carbon and be formed by processes such as spin coating. In an embodiment, the bottom masks 44 are formed by a coating/etch/coating (CEC) process comprising forming a coating over the source/drain regions 42, a-Si hard masks 58, and the first CESL 46, selectively etching portions of the coating over the a-Si hard masks 58 and the first CESL 46, and forming additional coatings and performing additional etches until a desired thickness of the bottom masks 44 is reached. In an embodiment, the bottom masks 44 may have a thickness in a range of about 15 nm to about 20 nm. The bottom masks 44 may protect the underlying source/drain regions 42 from damage by nitrogen during a subsequent nitridation, as described below with respect to FIG. 12A. Bottom masks 44 having thicknesses in a range of 15 nm to 20 nm may have sufficient thickness to prevent the gate spacers 38 from being modified by a later plasma treatment, such as e.g. the nitrogen plasma implantation described below with respect to FIG. 12A and may also protect the source/drain regions 42 from the nitrogen plasma doping. Embodiments having a thickness less than about 15 nm may not have sufficient thickness to prevent the gate spacers 38 from modified by the later plasma treatment or to protect the source/drain regions 42 from the nitrogen plasma doping. Embodiments having a height greater than about 20 nm may overfill the openings 60 and impede the later nitrogen plasma doping.

Figure 12A:
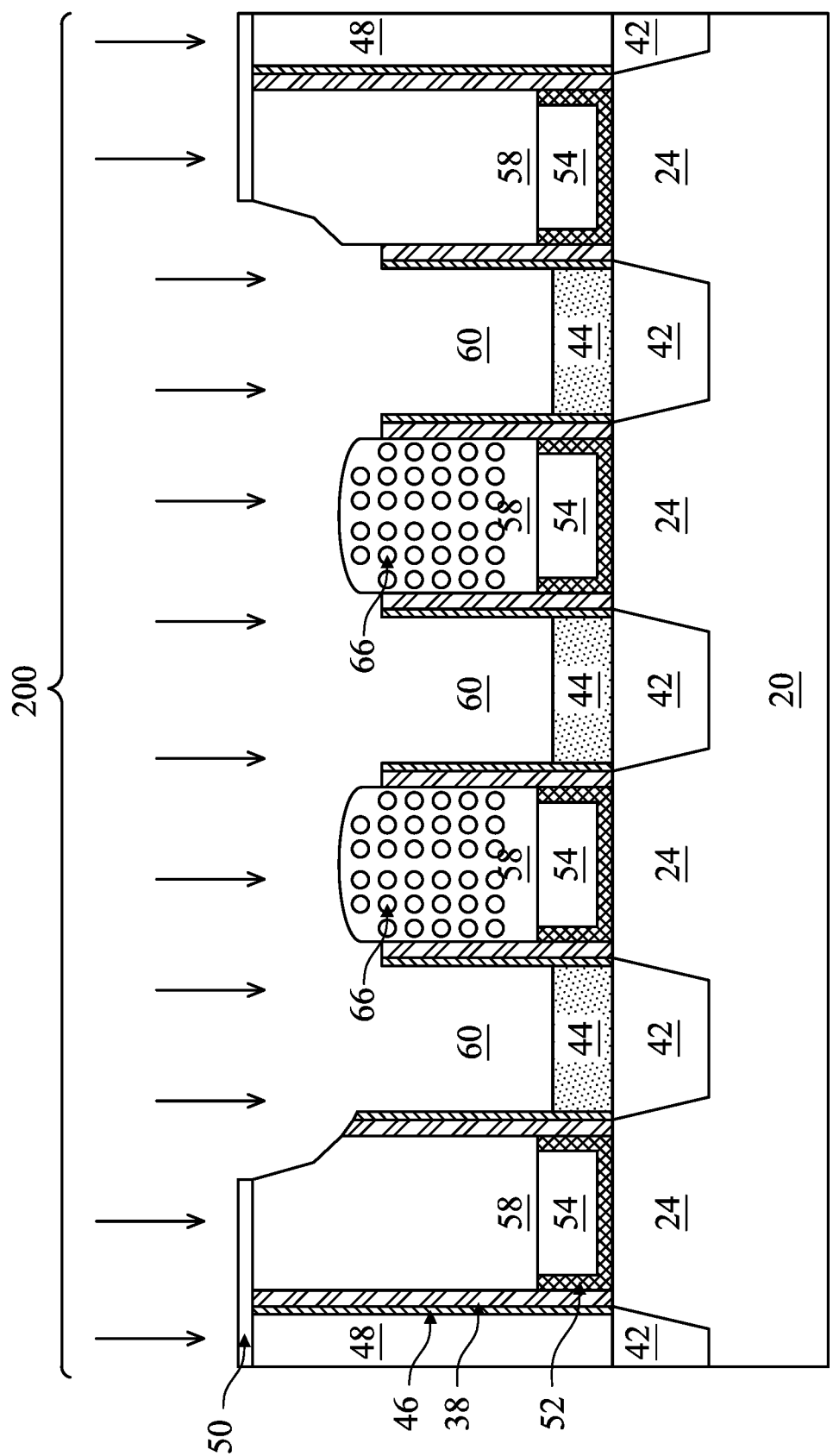

Next, as illustrated in FIG. 12A, a nitridation 200 is performed on the a-Si hard masks 58, implanting nitrogen 66 in the a-Si hard masks 58. In some embodiments, the nitridation 200 is performed by a nitrogen plasma doping process. The nitrogen plasma doping process may be performed with an implantation energy in a range of about 1 KeV to about 5 KeV and a dopant concentration in flow rate (using nitrogen as the dopant) in a range of about $1 \times 10^{15}$ cm$^{-2}$ to about $1 \times 10^{17}$ cm$^{-2}$. An implantation energy in a range of about 1 KeV to about 5 KeV and a flow rate dopant concentration of nitrogen in a range of about $1 \times 10^{15}$ atoms/cm$^2$ to about $1 \times 10^{17}$ atoms/cm$^2$ may produce a concentration of nitrogen in the a-Si hard masks 58 in a range of about $1 \times 10^{22}$ atoms/cm$^3$ to about $2.5 \times 10^{22}$ atoms/cm$^3$ along a surface region of the hard mask 58. A concentration of nitrogen in this range provide reduces or limits silicidation of the hard mask 58 during a subsequent silicidation process, thereby limiting the amount of hard mask 58 that is to be removed and allows a greater gate height. A concentration of nitrogen in the a-Si hard masks 58 of less than about $1 \times 10^{22}$ atoms/cm$^3$ may cause insufficient nitridation effectiveness in reducing the silicidation of the hard mask 58. A concentration of nitrogen in the a-Si hard masks 58 of greater than about $2.5 \times 10^{22}$ atoms/cm$^3$ may cause a low wafer-per-hour (WPH) throughput issue and increase production costs.

Still referring to FIG. 12A, in accordance with other embodiments, the nitridation 200 may be performed with a decoupled plasma nitridation (DPN) using nitrogen or NH$_3$. In some embodiments, the DPN is performed with a power in a range of about 50 W to about 1500 W, under a pressure in a range of about 10 mTorr to about 400 mTorr, and over a time period in a range of about 50 seconds to about 70 seconds. In some embodiments, the DPN is performed with a ratio of N$_2$ to a total amount of N$_2$ and carrier gas in a range of about 0.1 to about 0.4 and with a duty cycle (DC) in a range of about 10% to about 30%, wherein the duty cycle is the ratio of the active time of a wafer pulser voltage to the total period of the signal of the wafer pulser during the performance of the DPN. In other embodiments, the DPN is performed with a ratio of NH$_3$ to a total amount of NH$_3$ and carrier gas of about 2.5% and with a DC of about 20%.

In some embodiments, the nitridation 200 achieves nitrogen implantation such that the percentage of nitrogen atoms in the total atoms of the nitridated a-Si hard masks 58 (including N and Si atoms) is greater than about 40% to a depth range of about 6 to 8 nm, thereby making the properties of the nitridated a-Si hard masks 58 closer to SiN. A lower percentage of nitrogen and/or a lower depth may cause insufficient precision materials modification (PMM) effectiveness, so that the properties of the a-Si hard masks 58 remain closer to a-Si than to SiN, which may increase the amount of silicication on the nitridated a-Si hard masks 58 in a later process as described below with respect to FIGS. 13A-C. A higher percentage of nitrogen and/or a greater depth may cause shallower silicide formation on the nitridated a-Si hard masks 58. A ratio of the depth of the N—Si bonding to the overall height of the a-Si hard masks 58 may be in a range of about 40% to about 50%, thereby bringing the properties of the nitridated a-Si hard masks 58 similar to SiN. This may reduce the amount of silicication on the nitridated a-Si hard masks 58 in a later process. A lower ratio may cause insufficient nitridation, so that the properties of the a-Si hard masks 58 remain closer to a-Si than to SiN, which may increase the amount of silicication on the nitridated a-Si hard masks 58 in a later process. Achieving a higher ratio than 50% may lead to lowered production throughput. In a specific embodiment, the nitrogen plasma doping process is performed with an implantation energy of about 2 KeV and a dopant concentration (using nitrogen as the dopant) of about 5×10$^{16}$ cm$^{-2}$. In some embodiments, a thin silicide layer 74 that comprises TiSi is formed over the a-Si hard masks 58 in a later process, as discussed below in reference to FIG. 13A. The thickness of the thin silicide layer 74 can be controlled by adjusting the implantation energy and/or the dopant concentration of the nitridation 200, as described below with respect to FIGS. 13B and 13C.

Figure 12B:
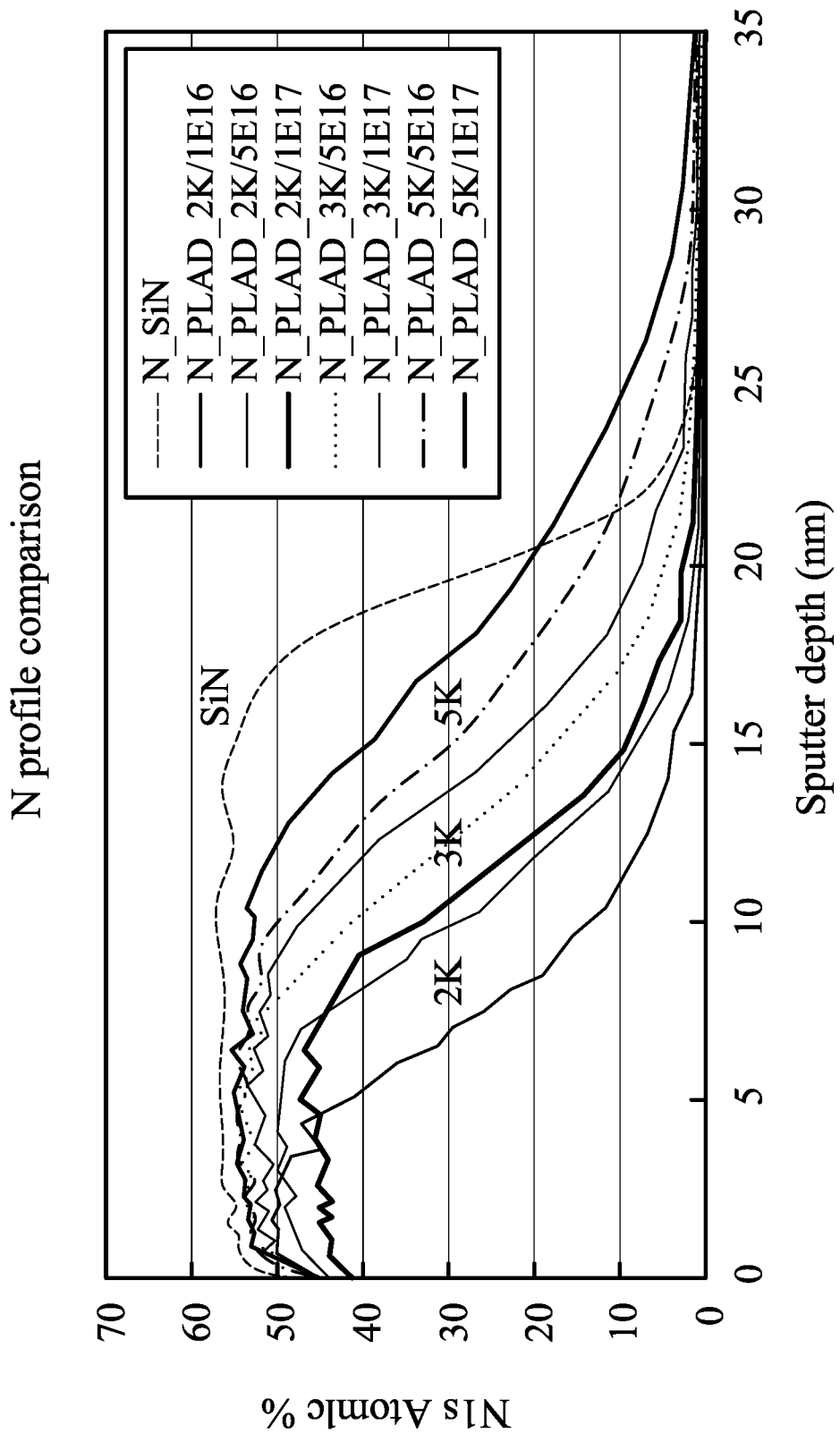
FIG. 12B illustrates nitrogen profiles formed in accordance with some embodiments.

FIG. 12B displays a comparison of the N profiles at increasing sputter depths in the a-Si hard masks 58 from the nitridation 200 as performed by the nitrogen plasma doping process with implantation energies in a range of about 2 KeV to about 5 KeV and nitrogen concentrations in a range of about 1×10$^{16}$ cm$^{-2}$ to about 1×10$^{17}$ cm$^{-2}$. As shown, nitrogen plasma doping with implantation energies of at least 2 KeV and nitrogen concentrations of at least 5×10$^{16}$ cm$^{-2}$ may produce N—Si bonding of 40% or greater to depths in a range of about 6 to about 8 nm. The N profile in a SiN layer is also shown for comparison.

Figure 12C:
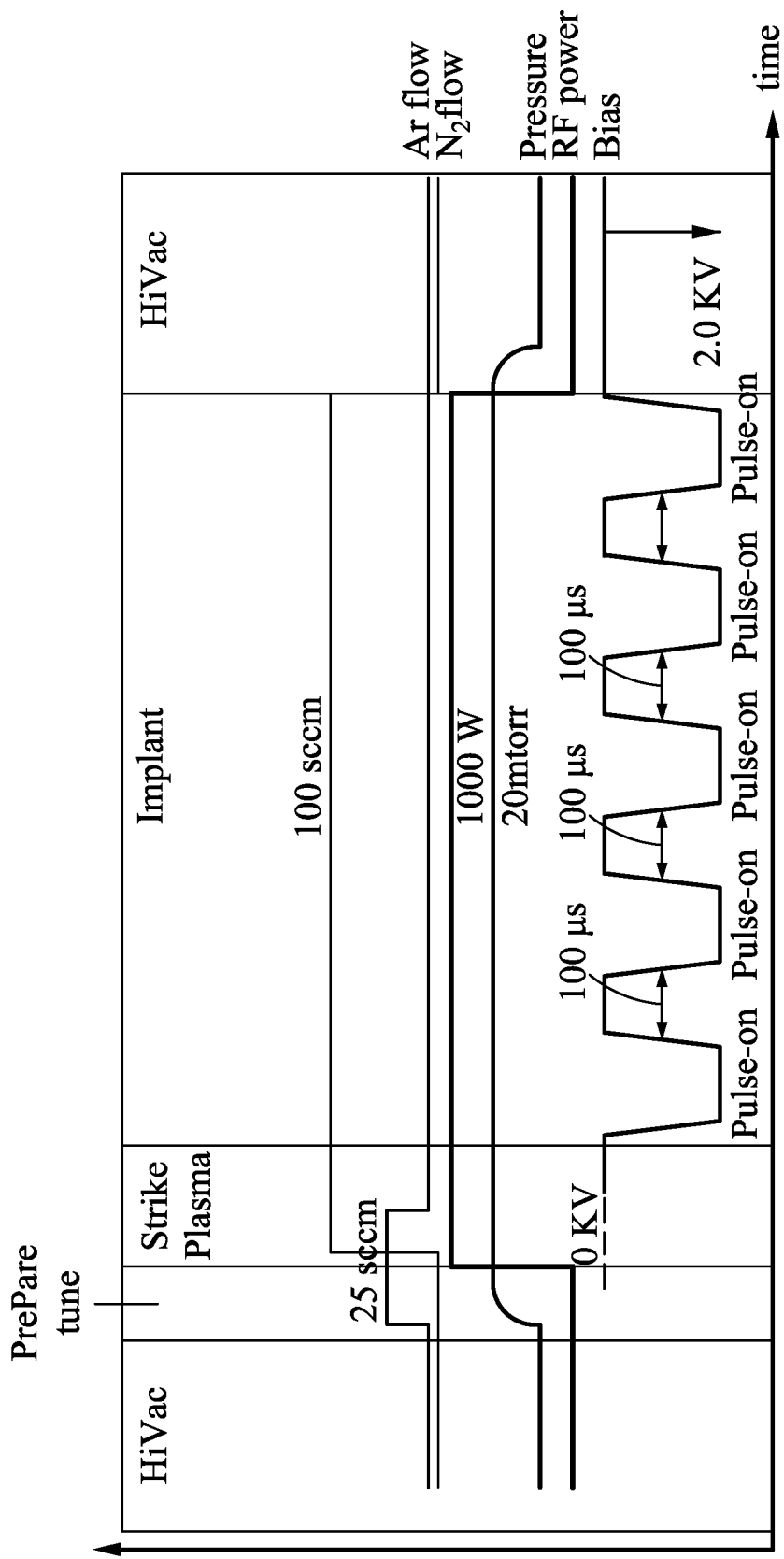
FIG. 12C illustrates details of performing a nitrogen plasma doping process, in accordance with some embodiments.

FIG. 12C shows details of performing the nitridation 200 with the nitrogen plasma doping process, in accordance with an embodiment. Throughout the nitrogen plasma doping process, a temperature of about room temperature (20° C. to 25° C.), a clamp voltage of 500 V used to clamp wafers on platen during processing, and a backside cooling flow of He of 1.8 sccm may be maintained. The backside cooling flow is applied to the bottom surface of the wafer 10 to maintain a uniform temperature throughout the wafer 10.

In an initial high vacuum (HiVac) step, a high vacuum with a pressure of below about 1×10$^{-2}$ Torr is maintained in a process chamber containing the wafer 10. In a following preparation/tuning step, the pressure in the process chamber may be raised to about 10 mTorr to about 400 mTorr, such as about 20 mTorr, by allowing a flow of Ar of about 25 sccm into the process chamber. The preparation/tuning step may have a duration in a range of about 10 seconds to about 100 seconds.

In a subsequent strike plasma step, an N$_2$ flow in a range of about 10 sccm to about 200 sccm is admitted into the process chamber. The Ar flow in a range of about 25 sccm to about 100 sccm is continued for a time interval in a range of about 10 seconds to about 100 seconds. The Ar and N$_2$ gases in the chamber are excited to a plasma state using an RF power in a range of about 500 W to about 1500 W as measured at the power supply. The strike plasma step may last for a duration in a range of about 0.1 seconds to about 5 seconds.

In a following implantation step, the flow of Ar gas is stopped while the N$_2$ flow in a range of about 25 sccm to about 100 sccm and the RF power of about 1500 W continue for a duration in a range of about 10 seconds to about 60 seconds. A bias voltage is applied in order to perform the nitrogen plasma implantation into the a-Si hard mask 58, using a wafer pulser voltage of about 2 kV, pulse lengths of about 100 µs, and a pulse frequency of about 5000 Hz. After the nitrogen plasma implantation is completed, a second high vacuum step is performed in which the N$_2$ flow, the bias voltage pulses, and the RF power are deactivated and the process chamber may be evacuated to a high vacuum state with a pressure below about 1 torr.

Figure 13A:
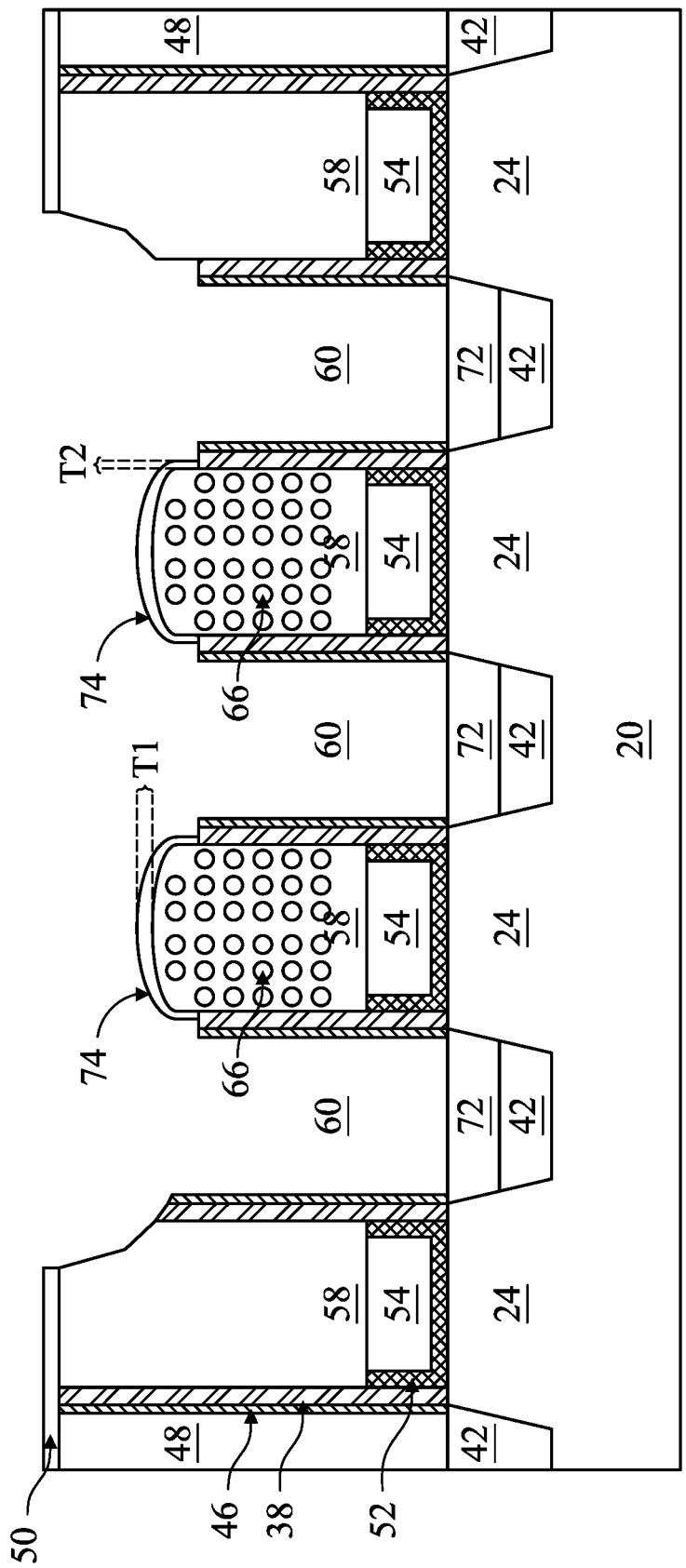

Next, referring to FIG. 13A, the bottom masks 44 are removed. The bottom masks 44 may be removed by a plasma ashing using a suitable reactive species such as oxygen or fluorine. However, the bottom masks 44 may be removed by any other suitable process, such as a dry or wet etching.

Still referring to FIG. 13A, silicide regions 72 are formed on the source/drain regions 42. Generally, the silicide regions 72 may be formed by depositing a conductive material (not shown) is formed over the source/drain regions 42 and annealing to cause the conductive material to react with the source/drain regions 42. For example, a conductive material such as titanium, copper, a copper alloy, silver, gold, tungsten, cobalt, aluminum, nickel, or the like, may be deposited by CVD. In some embodiments, the conductive material is Ti and is deposited with CVD at a temperature of about 400° C. over a duration from about 200 seconds to about 300 seconds, such as about 280 seconds. An anneal process, such as a rapid thermal anneal (RTA) or a spike RTA, causes the conductive material to react with the top portions of the source/drain regions 42 and form silicide regions 72 on the source/drain regions 42. The anneal may be performed using a spike RTA performed with gases such as N$_2$, H$_2$, O$_2$, and/or Ar at a temperature in a range of about 400° C. to about 600° C. In some embodiments, the conductive material is titanium and the silicide regions comprise TiSi.

Further referring to FIG. 13A, the thin silicide layer 74 may be formed over the nitridated a-Si regions 58 as a side effect of forming the silicide regions 72. The conductive material formed over the source/drain regions 42 may also be formed over the a-Si regions 58, which may also react with the conductive material and form the thin silicide layer 74 as illustrated in FIG. 13A. In some embodiments, the thin silicide layer 74 comprises TiSi. The use of a nitrogen plasma doping process to perform the nitridation 200, as described above with respect to FIGS. 12A-F, may prevent or reduce the growth of the thin silicide layer 74. In some embodiments in which the nitridation 200 is performed with a nitrogen plasma doping process using an implantation energy of 2 KeV and a flow rate dosage of $5\times10^{16}$ cm$^{-2}$, the thin silicide layer 74 may achieve a thickness T1 of about 4 nm or smaller on a top surface of the nitridated a-Si regions 58 and a thickness T2 of about 2 nm or smaller on sidewalls of the nitridated a-Si regions 58. These achieved thicknesses of the thin silicide layer 74 may prevent a loss of about 2.5 nm in the final metal gate height due to a later planarization removing a top portion of the metal gate in the process of removing the thin silicide layer 74.

FIG. 13B illustrates the effects of the nitrogen on the thickness of the thin silicide layer 74 at various implant energies in accordance with an embodiment using nitrogen plasma doping for the nitridation 200. In particular, FIG. 13B illustrates a thickness of TiSi formed on the a-Si hard mask using a flow rate of nitrogen at a concentration of about $5\times10^{16}$ cm$^{-2}$ at implant energies of 1 KeV through 5 KeV. When the nitrogen plasma doping is not performed, the thickness of the thin silicide layer 74 (referred to in FIG. 13B as "TiSi THK") may be in a range of about 65 Å to about 70 Å. With the nitrogen plasma doping performed with a nitrogen dopant concentration of about $5\times10^{16}$ cm$^{-2}$ and with implantation energies in a range of about 1 KeV to about 5 KeV, the thickness of the thin silicide layer 74 may be in a range of about 50 Å to about 55 Å. As illustrated in FIG. 13B, increasing the implantation energy above about 2 KeV may have little effect on the thickness of the thin silicide layer 74 with. This may occur because the nitrogen dopant concentration of about $5\times10^{16}$ cm$^{-2}$ causes sufficient Si—N bonding at the surface of the a-Si hard masks 58 to achieve TiSi thickness below about 55 Å. Therefore it is advantageous to have an implantation energy of at least 2 KeV, as this may minimize the thickness of the thin silicide layer 74 and preserve the heights of the replacement gate stacks 56 after a subsequent planarization.

FIG. 13C illustrates the effects of changing the dopant concentration of the nitrogen on the thickness of the thin silicide layer 74 in accordance with using nitrogen plasma doping for the nitridation 200. In particular, FIG. 13C illustrates a thickness of TiSi formed on the a-Si hard mask using an implant energy of 2 KeV and a flow rate of nitrogen at concentration of about $1\times10^{16}$ cm$^{-2}$ to about $5\times10^{16}$ cm$^{-2}$. When the nitrogen plasma doping is not performed, the thickness of the thin silicide layer 74 may be in a range of about 65 Å to about 70 Å. With the nitrogen plasma doping performed with an implantation energy of about 2 KeV and with a nitrogen dopant concentration of about $1\times10^{16}$ cm$^{-2}$, the thickness of the thin silicide layer 74 may be in a range of about 50 Å to about 55 Å. As the nitrogen dopant concentration is increased to about $5\times10^{16}$ cm$^{-2}$, the thickness of the thin silicide layer 74 decreases to below about 50 Å. As illustrated by FIG. 13C, increasing the nitrogen dopant concentration to about $5\times10^{16}$ cm$^{-2}$ may achieve thinner thicknesses of TiSi over the a-Si hard masks 58 by changing the properties of the a-Si hard mask 58 to be closer to SiN. This is advantageous because minimizing the thickness of the thin silicide layer 74 may preserve the heights of the replacement gate stacks 56 after a subsequent planarization.

Figure 14:
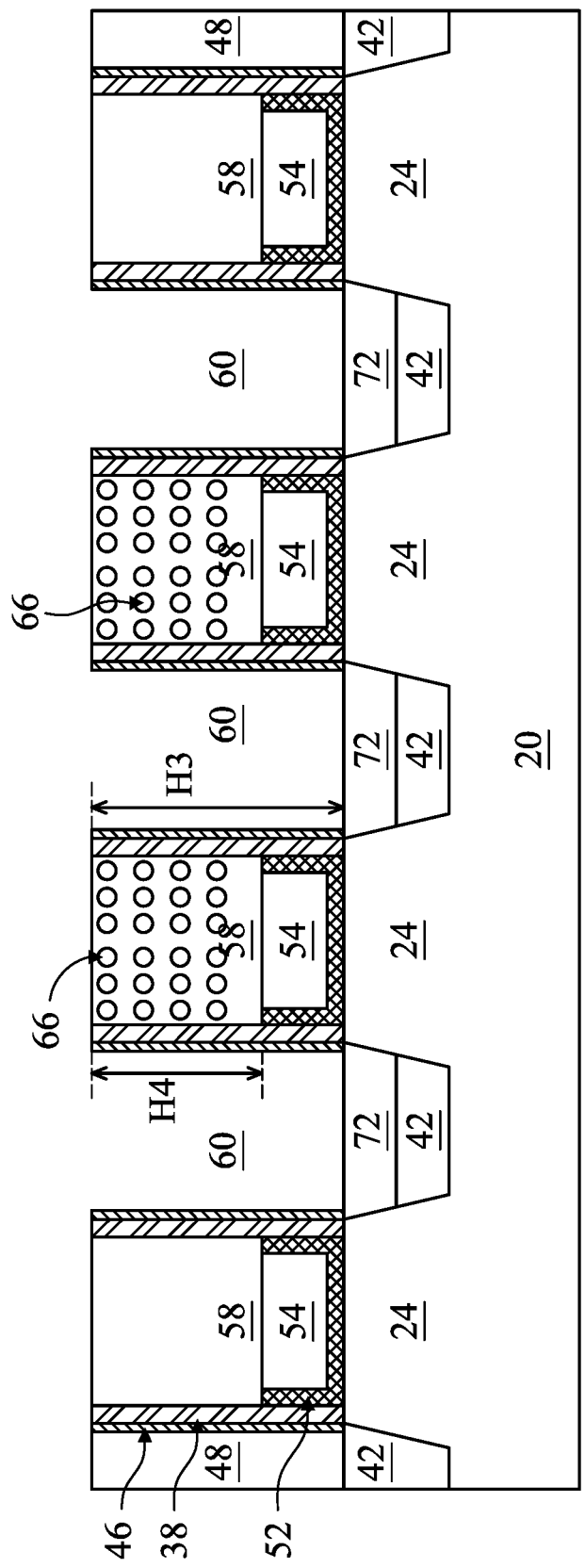

Next, as shown in FIG. 14, a planarization such as a chemical mechanical polish (CMP) is performed, removing top regions of the nitridated a-Si hard masks 58, remaining portions of the photoresist 50, and upper portions of the gate spacers 38 and the first CESL 46. The lower thickness of the thin silicide layer 74 achieved by the nitridation 200 may allow for the planarization to be performed at a greater height from the replacement gate stacks 56, which reduces the probability that the replacement gate stacks 56 will lose material during the planarization. The concentration of the implanted nitrogen 66 with respect to the total atoms in the remaining portions of the a-Si hard masks 58 may be in a range of about 40% to about 50% at top surfaces of the a-Si hard masks 58 and in a range of about 20% to about 30% at bottom surfaces of the a-Si hard masks 58. The implanted nitrogen 66 may have a density gradient of $2.5\times10^{22}$ atoms/cm$^2$/nm from the top surfaces of the a-Si hard masks to the bottom surfaces of the a-Si hard masks. After the planarization, the replacement gate stacks 56 (comprising gate electrodes 54 and gate dielectrics 52) and the remaining portions of the a-Si hard masks 58 may have total heights H3 in a range of about 25 nm to about 60 nm, and the remaining portions of the a-Si hard masks 58 may have heights H4 in a range of about 15 nm to about 25 nm. The ratio of the total heights H3 of the replacement gate stacks 56 and the remaining portions of the a-Si hard masks 58 to the height H4 of the remaining portions of the a-Si hard masks 58 may be in a range of about 10:30 to about 20:20. It is advantageous for the ratio of H3:H4 to be in a range of about 2:1 and about 1:1 because this may allow for greater height of the source/drain contact plugs 76, as described below with respect to FIG. 15. A ratio of H3:H4 of greater than about 2:1 may cause loss of metal gate height due to the planarization.

Figure 15:
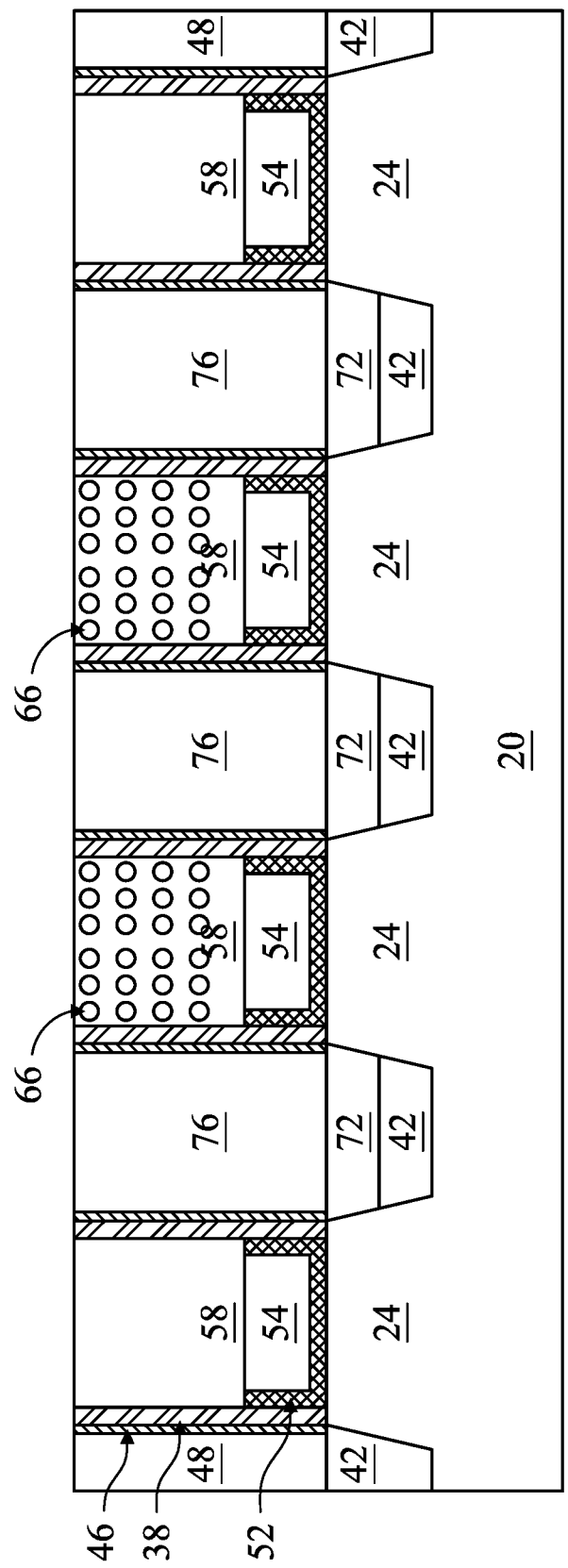

Next, as illustrated in FIG. 15, a conductive material is then filled into contact openings 60, contacting the silicide regions 72 disposed on the source/drain regions 42, to form source/drain contact plugs 76. The source/drain contact plugs 76 may comprise one or more layers. For example, in some embodiments, the source/drain contact plugs 76 comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess material from a surface of the first ILD 48. The remaining liner and conductive material form the source/drain contact plugs 76 in the openings.

Figure 16:
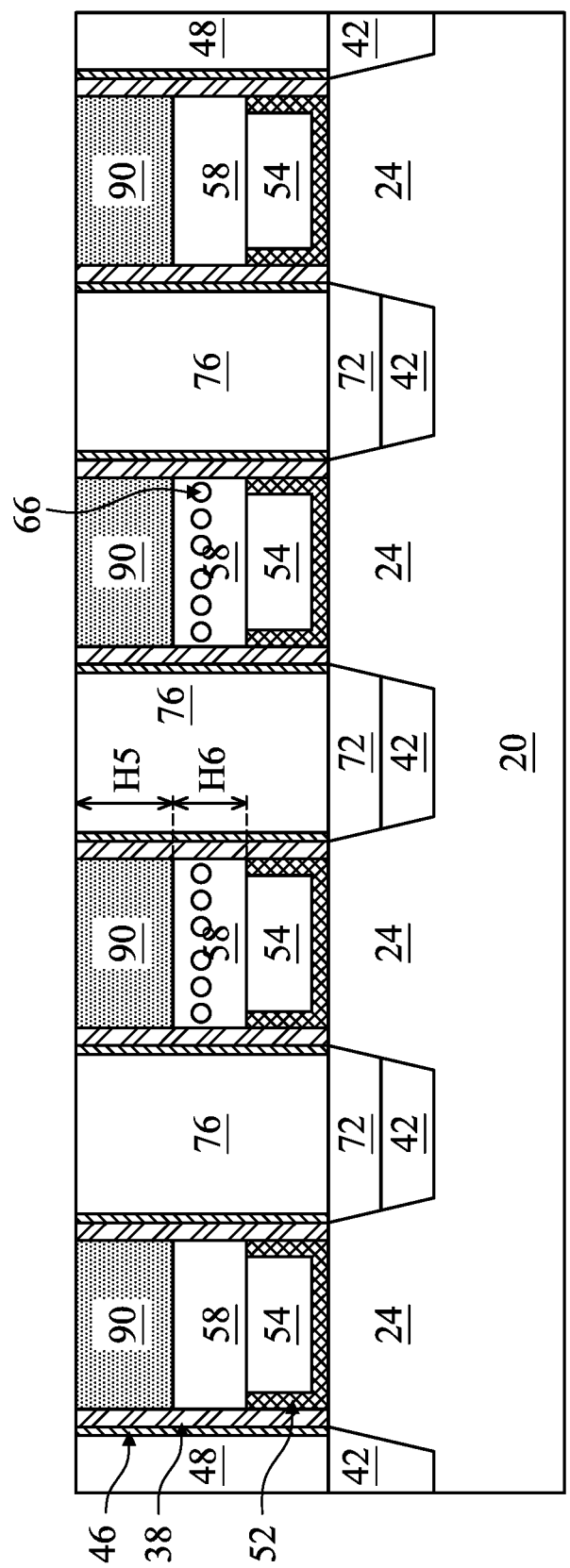

In FIG. 16, portions of the nitridated a-Si hard masks 58 are removed and replaced by hard masks 90. The hard masks 90 may comprise materials such as silicon nitride (SiN), silicon oxide, silicon carbide, silicon oxycarbide, silicon oxynitride, the like, or a combination thereof. The portions of the a-Si hard masks 58 may be removed by a suitable process such as dry etching. The hard masks 90 may be formed by a process such as CVD, PECVD, ALD, the like, or a combination thereof. The portions of the a-Si hard masks 58 are replaced by the hard masks 90 in order to prevent shorts due to the semiconducting a-Si material of the a-Si hard masks 58 when gate contact plugs 88 are formed in a following step, as illustrated below in FIG. 17. The hard masks 90 may have a height H5 in a range from about 10 nm to about 30 nm. The remaining portion of the nitridated a-Si hard masks 58 may have a height H6 in a range from about 10 nm to about 30 nm. The density of nitrogen in atomic percent at a top surface of the remaining portions of the nitridated a-Si hard masks 58 may be in a range of about 40% to about 50%. The density of nitrogen at a bottom surface of the remaining portions of the nitridated a-Si hard masks 58 may be in a range of about 20% to about 30%.

Figure 17:
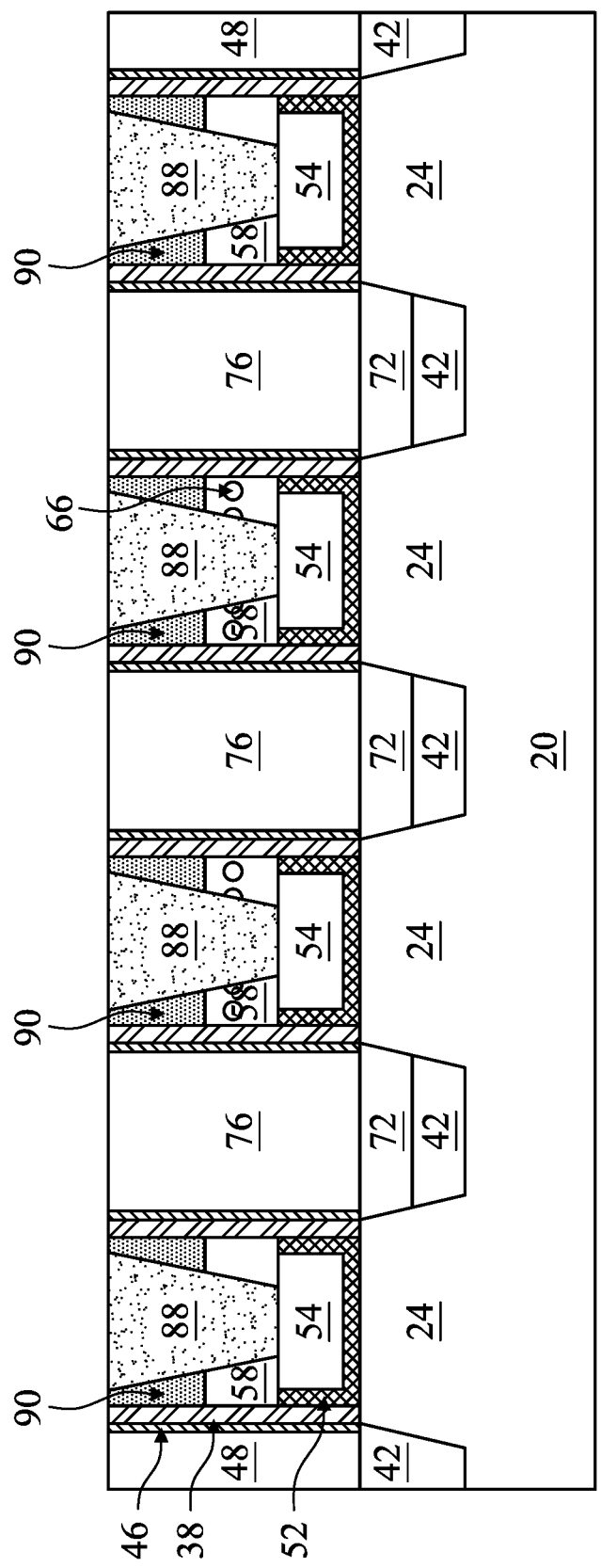

FIG. 17 illustrates formation of the gate contact plugs 88 contacting the gate electrodes 54 in accordance with some embodiments. The gate contact plugs 88 can be formed using similar processes and materials as described above to form the source/drain contact plugs 76. The formation of the source/drain contact plugs 76 and the gate contact plugs 88 are discussed as being formed in separate processes for purposes of illustration. In some embodiments, the source/drain contact plugs 76 and the gate contact plugs 88 may be formed simultaneously. Additionally, although shown as being formed in the same cross-sections, it should be appreciated that each of the source/drain contact plugs 76 and gate contact plugs 88 may be formed in different cross-sections, which may avoid shorting of the contacts.

Figure 18:
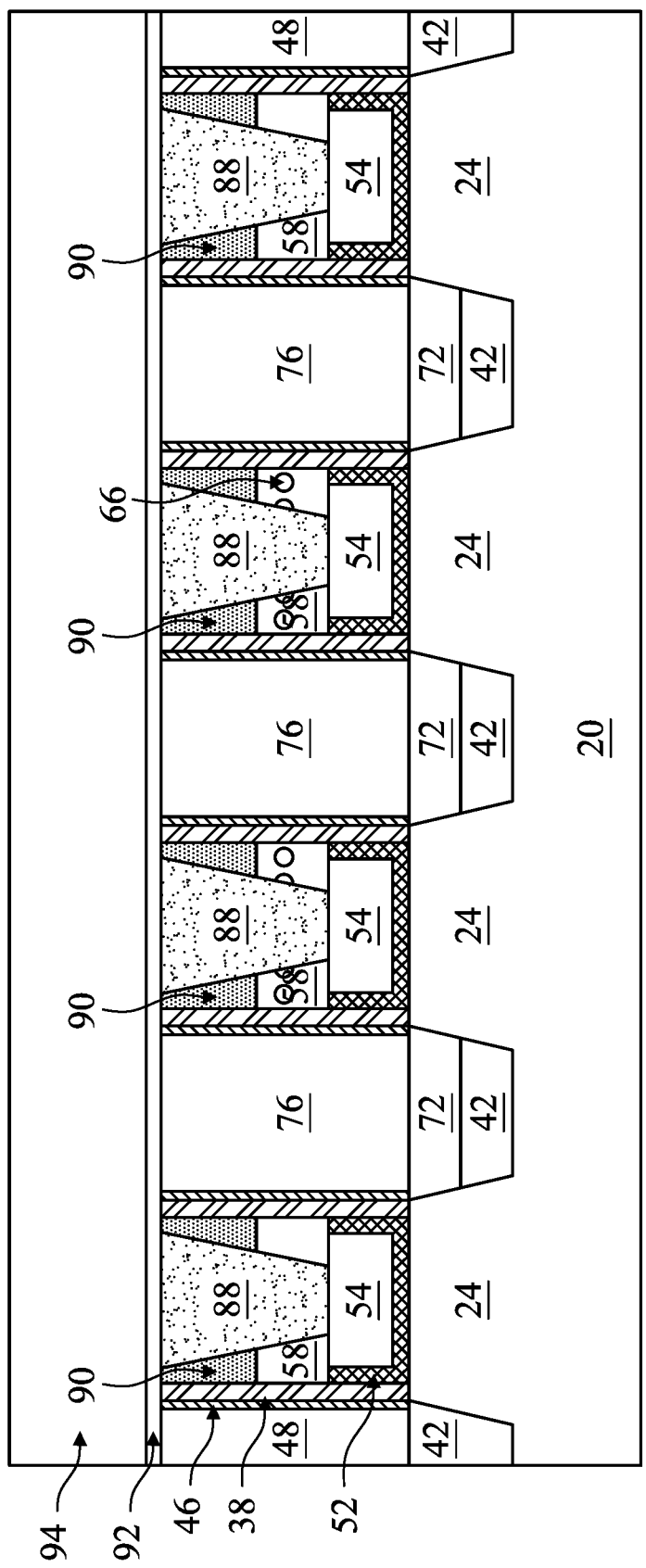

In FIG. 18, a second contact etch stop layer (CESL) 92 and a second ILD 94 are formed. The second CESL 92 may comprise or be silicon nitride, silicon carbon nitride, silicon carbon oxide, carbon nitride, the like, or a combination thereof, and may be deposited by CVD, plasma enhanced CVD (PECVD), ALD, or another deposition technique. The second ILD 94 is formed on the second CESL 92 and may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 94 may be deposited by spin-on, CVD, flowable CVD (FCVD), PECVD, PVD, or another deposition technique.

Figure 19:
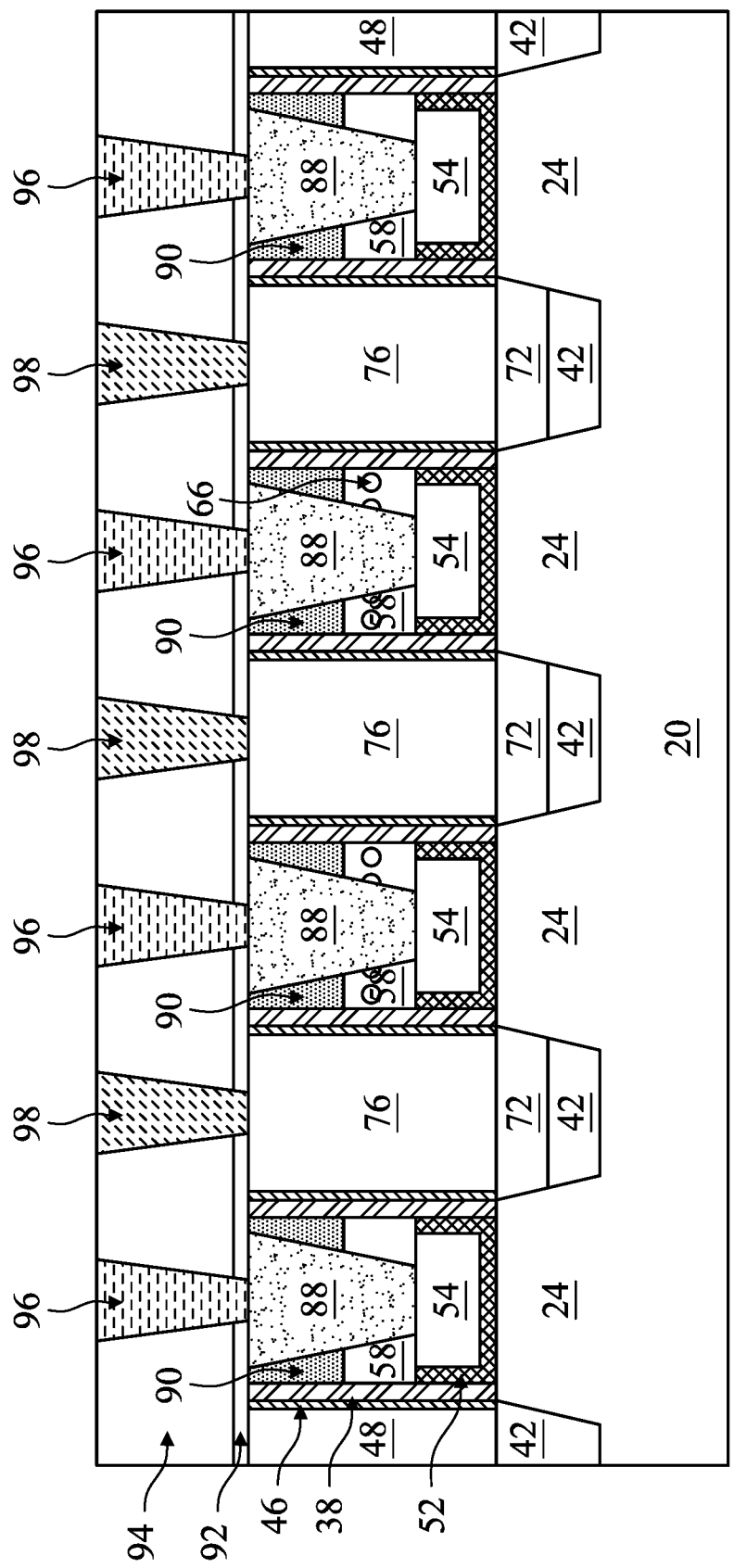

In FIG. 19, conductive features 96 and 98 are formed through the second CESL 92 and the second ILD 94 to contact the gate contact plugs 88 and the source/drain contact plugs 76, respectively. Openings for the conductive features 96 and 98 may be formed through the second CESL 92 and the second ILD 94 using acceptable photolithography and etching techniques. The conductive features 96 and 98 can be deposited by CVD, ALD, electroless deposition (ELD), PVD, electroplating, or another deposition technique. The conductive features 96 and 98 may be or comprise tungsten, cobalt, copper, ruthenium, aluminum, gold, silver, alloys thereof, the like, or a combination thereof. The conductive features 96 and 98 may be or may be referred to as a contact, plug, metal plug, conductive line, conductive pad, via, via-to-interconnect layer ($V_0$), etc.

The embodiments of the present disclosure have some advantageous features. Greater gate heights can be achieved by using an a-Si hard mask in place of a SiN hard mask. The nitridation of the a-Si hard mask may reduce the thickness of silicide formed on the a-Si hard mask, increasing the final metal gate height by about 2.5 nm. This may prevent a loss of metal gate height in a subsequent planarization process. The nitridation may be performed with a plasma doping process, and both energy and dosage of the nitrogen plasma doping may be adjusted to optimize the nitrogen concentration in the a-Si hard mask and prevent silicide formation on the a-Si mask. In embodiments of the present disclosure, the implanted nitrogen in remaining portions of the a-Si hard mask remains in devices produced by the methods disclosed herein.

In accordance with an embodiment, a method of forming a semiconductor device includes forming a source/drain region and a gate electrode adjacent the source/drain region, forming a hard mask over the gate electrode, forming a bottom mask over the source/drain region, performing a nitridation process on the hard mask over the gate electrode such that the bottom mask remains over the source/drain region during the nitridation process, removing the bottom mask, and forming a silicide over the source/drain region. In an embodiment, forming the silicide further forms a silicide over the hard mask, such that a thickness of the silicide over the source/drain region is greater than a thickness of the silicide over the hard mask. In an embodiment, performing the nitridation includes performing a nitrogen plasma doping process. In an embodiment, the nitrogen plasma doping process includes an implantation energy in a range of about 1 KeV to about 5 KeV. In an embodiment, the nitrogen plasma doping process includes a nitrogen dosage concentration in a range of about $1 \times 10^{16}$ $cm^{-2}$ to about $1 \times 10^{17}$ $cm^{-2}$. In an embodiment, the nitrogen plasma doping process includes an $N_2$ flow of about 100 sccm and an RF power of about 1500 W. In an embodiment, the nitrogen plasma doping process includes a wafer pulser voltage of about 2 kV, pulse lengths of about 100 µs, and a pulse frequency of about 5000 Hz. In an embodiment, the nitrogen plasma doping process includes performing an implantation for a time interval in a range of about 10 seconds to about 90 seconds. In an embodiment, the nitrogen plasma doping process is performed at a pressure in a range of about 10 mTorr to about 400 mTorr.

In accordance with another embodiment, a method of forming a semiconductor structure includes forming a first source/drain region and a second source/drain region, a gate electrode adjacent the first source/drain region and the second source/drain region, and a first interlayer dielectric (ILD) over the first source/drain region and the second source/drain region, forming a hard mask over the gate electrode, the hard mask including amorphous silicon, forming an opening through the first ILD, the opening exposing the first source/drain region, forming a bottom mask on the first source/drain region, performing a nitridation process on the hard mask, removing the bottom mask, forming a first silicide layer on the first source/drain region and a second silicide layer on the hard mask, planarizing the second silicide layer on the hard mask, the planarizing removing the second silicide layer from the hard mask, and forming a source/drain contact plug on the first silicide layer. In an embodiment, the second silicide layer includes TiSi. In an embodiment, after the nitridation process, the hard mask includes N—Si bonding of greater than 40% at a depth in a range of about 6 nm to about 8 nm. In an embodiment, after the nitridation process, the hard mask has a nitrogen concentration in a range of about 40% to about 50% at a top surface of the hard mask. In an embodiment, after the nitridation process, the hard mask has a nitrogen concentration in a range of about 20% to about 30% at a bottom surface of the hard mask. In an embodiment, forming the opening through the first ILD includes etching the hard mask to have a rounded top portion with a height in a range of about 3 nm to about 7 nm.

In accordance with yet another embodiment, a semiconductor device includes a metal gate disposed on a substrate, a source/drain region adjacent to the metal gate such that the source/drain region is covered by a silicide, a first hard mask covering the metal gate such that the first hard mask includes amorphous silicon and such that the first hard mask further includes nitrogen at a density in a range of about 30% to about 50%, and a second hard mask covering the first hard mask. In an embodiment, the silicide includes titanium. In an embodiment, the first hard mask includes N—Si bonding of greater than 40% at a depth in a range of about 6 nm to about 8 nm. In an embodiment, the first hard mask has a nitrogen concentration in a range of about 40% to about 50% at a top surface of the first hard mask, and wherein the first hard mask has a nitrogen concentration in a range of about 20% to about 30% at a bottom surface of the first hard mask. In an embodiment, the first hard mask has a height in a range of about 15 nm to about 25 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a source/drain region and a gate electrode adjacent the source/drain region;
    forming a hard mask over the gate electrode;
    forming a bottom mask over the source/drain region;
    performing a nitridation process on the hard mask over the gate electrode, wherein the bottom mask remains over the source/drain region during the nitridation process;
    removing the bottom mask; and
    forming a silicide over the source/drain region.

2. The method of claim 1, wherein forming the silicide further forms a silicide over the hard mask, wherein a thickness of the silicide over the source/drain region is greater than a thickness of the silicide over the hard mask.

3. The method of claim 1, wherein performing the nitridation process comprises performing a nitrogen plasma doping process.

4. The method of claim 3, wherein the nitrogen plasma doping process comprises an implantation energy in a range of about 1 KeV to about 5 KeV.

5. The method of claim 3, wherein the nitrogen plasma doping process comprises a nitrogen dosage concentration in a range of about $1 \times 10^{16}$ cm$^{-2}$ to about $1 \times 10^{17}$ cm$^{-2}$.

6. The method of claim 3, wherein the nitrogen plasma doping process comprises an $N_2$ flow of about 100 sccm and an RF power of about 1500 W.

7. The method of claim 3, wherein the nitrogen plasma doping process comprises a wafer pulser voltage of about 2 kV, pulse lengths of about 100 µs, and a pulse frequency of about 5000 Hz.

8. The method of claim 3, wherein the nitrogen plasma doping process comprises performing an implantation for a time interval in a range of about 10 seconds to about 90 seconds.

9. The method of claim 3, wherein the nitrogen plasma doping process is performed at a pressure in a range of about 10 mTorr to about 400 mTorr.

10. A method of forming a semiconductor structure, the method comprising:
    forming a first source/drain region and a second source/drain region, a gate electrode adjacent the first source/drain region and the second source/drain region, and a first interlayer dielectric (ILD) over the first source/drain region and the second source/drain region;
    forming a hard mask over the gate electrode, the hard mask comprising amorphous silicon;
    forming an opening through the first ILD, the opening exposing the first source/drain region;
    forming a bottom mask on the first source/drain region;
    performing a nitridation process on the hard mask;
    removing the bottom mask;
    forming a first silicide layer on the first source/drain region and a second silicide layer on the hard mask;
    planarizing the second silicide layer on the hard mask, the planarizing removing the second silicide layer from the hard mask; and
    forming a source/drain contact plug on the first silicide layer.

11. The method of claim 10, wherein the second silicide layer comprises TiSi.

12. The method of claim 10, wherein after the nitridation process, the hard mask comprises N—Si bonding of greater than 40% at a depth in a range of about 6 nm to about 8 nm.

13. The method of claim 10, wherein after the nitridation process, the hard mask has a nitrogen concentration in a range of about 40% to about 50% at a top surface of the hard mask.

14. The method of claim 10, wherein after the nitridation process, the hard mask has a nitrogen concentration in a range of about 20% to about 30% at a bottom surface of the hard mask.

15. The method of claim 10, wherein forming the opening through the first ILD comprises etching the hard mask to have a rounded top portion with a height in a range of about 3 nm to about 7 nm.

16. A method of forming a semiconductor structure, the method comprising:
    forming an amorphous silicon (a-Si) layer over a gate stack, the gate stack being adjacent a source/drain region covered by a dielectric layer;
    exposing a top surface of the source/drain region;
    covering the source/drain region with a first mask;
    implanting nitrogen in the a-Si layer with a nitrogen plasma doping process;
    removing the first mask;
    forming a silicide layer over the source/drain region and the a-Si layer; and
    removing the silicide layer from over the a-Si layer.

17. The method of claim 16, further comprising recessing the gate stack prior to forming the a-Si layer, wherein forming the a-Si layer comprises:
    depositing an a-Si material over the gate stack; and
    removing excess portions of the a-Si material with a planarization.

18. The method of claim 16, wherein the silicide layer comprises titanium.

19. The method of claim 16, wherein removing the silicide layer from over the a-Si layer comprises a planarization, the planarization removing a top portion of the a-Si layer.

20. The method of claim 19, wherein after the planarization, a remaining portion of the a-Si layer has a first height, the remaining portion of the a-Si layer and the gate stack have a combined second height, and a ratio of the combined second height to the first height is in a range of 2:1 to 1:1.

* * * * *